United States Patent
Goto

(10) Patent No.: US 9,733,320 B2
(45) Date of Patent: Aug. 15, 2017

(54) DETECTING APPARATUS, MEDICAL APPARATUS AND METHOD FOR DETECTING A POSITION OF A PREDETERMINED PART OF A SUBJECT

(71) Applicant: GE Medical Systems Global Technology Company, LLC, Waukesha, WI (US)

(72) Inventor: Takao Goto, Tokyo (JP)

(73) Assignee: General Electric Company, Schenectady, NY (US)

( * ) Notice: Subject to any disclaimer, the term of this patent is extended or adjusted under 35 U.S.C. 154(b) by 1084 days.

(21) Appl. No.: 13/930,162

(22) Filed: Jun. 28, 2013

(65) Prior Publication Data

US 2014/0002079 A1 Jan. 2, 2014

(30) Foreign Application Priority Data

Jun. 29, 2012 (JP) ................................. 2012-147117

(51) Int. Cl.
  *G01R 33/32* (2006.01)
  *G01R 33/54* (2006.01)
  *G01R 33/563* (2006.01)

(52) U.S. Cl.
  CPC .......... *G01R 33/32* (2013.01); *G01R 33/543* (2013.01); *G01R 33/5635* (2013.01)

(58) Field of Classification Search
  CPC ... G01R 33/32; G01R 33/543; G01R 33/5635
  See application file for complete search history.

(56) References Cited

U.S. PATENT DOCUMENTS

| | | | |
|---|---|---|---|
| 5,542,003 A | 7/1996 | Wofford | |
| 6,771,803 B1 * | 8/2004 | Turek | G06T 7/0083 382/131 |
| 7,072,707 B2 * | 7/2006 | Galloway, Jr. | A61B 90/36 600/407 |
| 7,260,249 B2 | 8/2007 | Smith | |
| 7,346,383 B2 * | 3/2008 | Riederer | G01R 33/56375 600/407 |
| 7,890,156 B2 | 2/2011 | Ooi et al. | |

(Continued)

FOREIGN PATENT DOCUMENTS

| | | |
|---|---|---|
| JP | 11053564 A | 2/1999 |
| JP | 2003281539 A | 10/2003 |

(Continued)

*Primary Examiner* — Dixomara Vargas

(57) ABSTRACT

A detecting apparatus configured to detect a position of a predetermined part of a subject, based on image data of a region including the predetermined part is provided. The detecting apparatus includes a first detecting unit configured to detect a reference position used when the position of the predetermined part is detected, the reference position detected from within the image data, a determining unit configured to rotate a window for detecting the position of the predetermined part about the reference position, and configured to determine a rotational angle of the window when the predetermined part is included in the window, and a second detecting unit configured to set an actual rotational angle of the window to the determined rotational angle and configured to detect the position of the predetermined part from within the window.

17 Claims, 23 Drawing Sheets

(56) References Cited

U.S. PATENT DOCUMENTS

| | | | |
|---|---|---|---|
| 8,068,651 B2 | 11/2011 | Takase et al. | |
| 8,728,070 B2 * | 5/2014 | Azamian | A61B 17/00234 |
| | | | 606/32 |
| 9,324,148 B2 * | 4/2016 | Ishikawa | G06T 7/0028 |
| 2011/0123086 A1 | 5/2011 | Nie et al. | |
| 2012/0177265 A1 | 7/2012 | Yoshiara et al. | |

FOREIGN PATENT DOCUMENTS

| | | |
|---|---|---|
| JP | 2009261904 A | 11/2009 |
| WO | 2011055742 A1 | 5/2011 |

* cited by examiner

US 9,733,320 B2

DETECTING APPARATUS, MEDICAL APPARATUS AND METHOD FOR DETECTING A POSITION OF A PREDETERMINED PART OF A SUBJECT

CROSS REFERENCE TO RELATED APPLICATIONS

This application claims the benefit of Japanese Patent Application No. 2012-147117 filed Jun. 29, 2012, which is hereby incorporated by reference in its entirety.

BACKGROUND OF THE INVENTION

The present invention relates to a detecting apparatus which detects a position of a predetermined part, a medical apparatus equipped with the detecting apparatus, and a method for detecting a position of a predetermined part of a subject.

There has heretofore been known a magnetic resonance imaging apparatus which images a subject using a contrast agent (See, for example, Japanese Unexamined Patent Publication No. 2009-261904).

As one example of methods each of which images a subject using a contrast agent, there is known a method in which an operator finds the position of a blood vessel from within image data and sets a tracker region for detecting the contrast agent to the position of the blood vessel. In this method, imaging is performed when a predetermined amount of contrast agent has reached the tracker region. An inexperienced operator can however need a long time to find the position of the blood vessel and set the tracker region to a location different from the blood vessel. There has therefore been a demand for the development of a method for automatically detecting a blood vessel in a short time.

BRIEF DESCRIPTION OF THE INVENTION

In a first aspect, a detecting apparatus which detects a position of a predetermined part of a subject, based on image data of a region including the predetermined part is provided, the detecting apparatus includes a first detecting unit which detects a reference position used when the position of the predetermined part is detected, from within the image data, a determining unit which rotates a window for detecting the position of the predetermined part centering on the reference position, and determines a rotational angle of the window when the predetermined part is included in the window, and a second detecting unit which sets the rotational angle of the window to the rotational angle determined by the determining unit and detects the position of the predetermined part from within the window.

In a second aspect, a medical apparatus equipped with the detecting apparatus of the first aspect is provided.

In a third aspect, a program for detecting a position of a predetermined part of a subject, based on image data of a region including the predetermined part is provided. The program causes a computer to execute a first detecting process which detects a reference position used when the position of the predetermined part is detected, from within the image data, a determining process which rotates a window for detecting the position of the predetermined part centering on the reference position, and determines a rotational angle of the window when the predetermined part is included in the window, and a second detecting process which sets the rotational angle of the window to the rotational angle determined by the determining process and detects the position of the predetermined part from within the window.

After a rotational angle of a window at the time that a predetermined part is included in the window has been determined, the position of the predetermined part is detected from within the window. It is thus possible to detect the predetermined part in a short period of time.

Advantages of the embodiments described herein will be apparent from the following description as illustrated in the accompanying drawings.

DETAILED DESCRIPTION OF THE INVENTION

While exemplary embodiments will hereinafter be described, the disclosure is not limited to the following exemplary embodiments.

(1) First Embodiment

Figure 1:
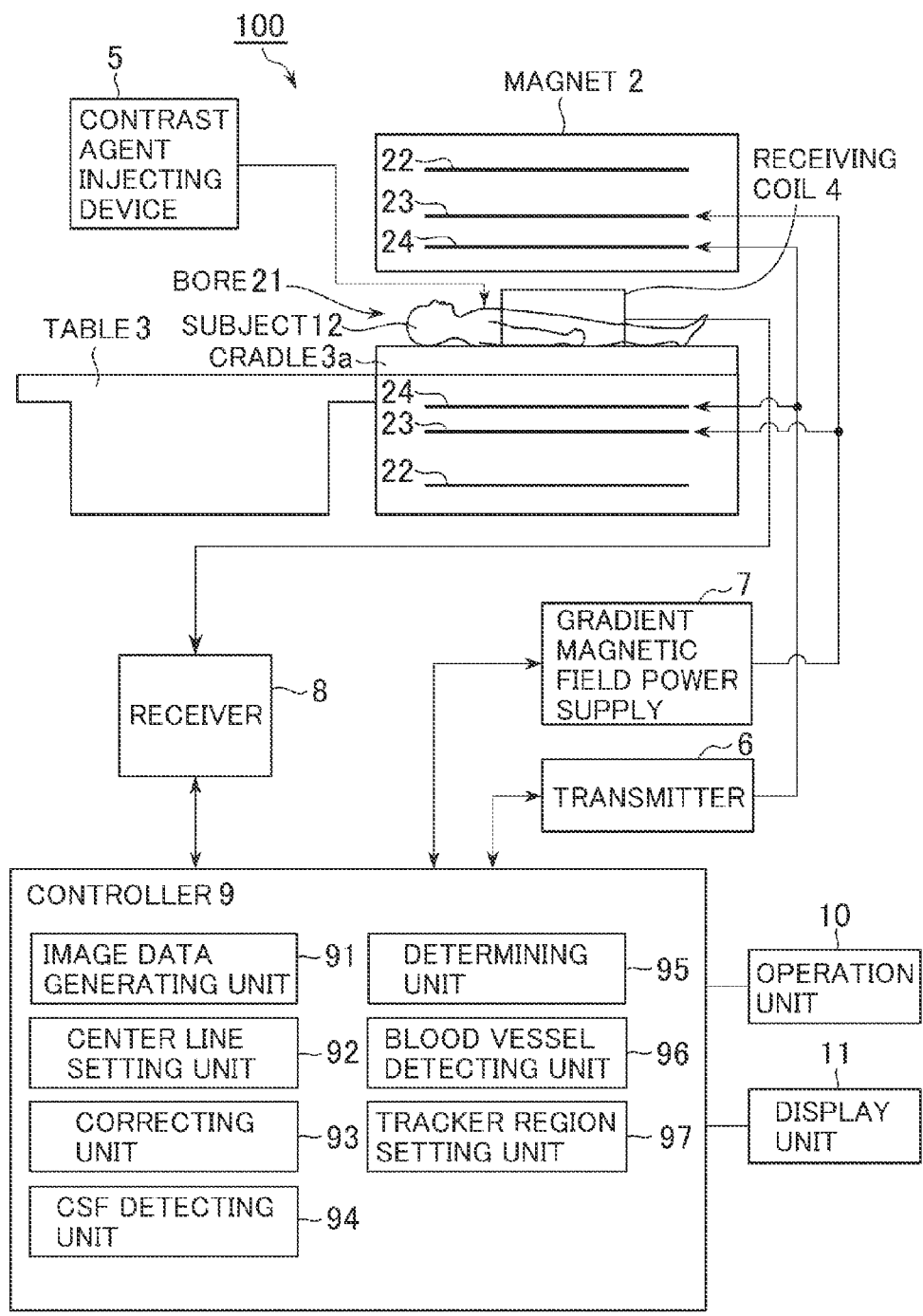
FIG. 1 is a schematic diagram of a magnetic resonance apparatus according to a first embodiment.

FIG. 1 is a schematic diagram of a magnetic resonance apparatus according to a first embodiment.

The magnetic resonance apparatus (hereinafter called "MR apparatus") 100 has a magnet 2, a table 3, a receiving coil 4, etc.

The magnet 2 has a bore 21 in which a subject 12 is accommodated, a superconductive coil 22, a gradient coil 23 and an RF coil 24. The superconductive coil 22 forms a static magnetic field, the gradient coil 23 generates a gradient magnetic field, and the RF coil 24 generates an RF pulse. Incidentally, a permanent magnet may be used instead of the superconductive coil 22.

The table 3 has a cradle 3a. The cradle 3a is configured so as to be movable within the bore 21. The subject 12 is carried in the bore 21 by the cradle 3a.

The receiving coil 4 is attached to an abdominal region of the subject 12. The receiving coil 4 receives magnetic resonance signals from the subject 12.

The MR apparatus 100 further includes a contrast agent injecting device 5, a transmitter 6, a gradient magnetic field power supply 7, a receiver 8, a controller 9, an operation unit 10 and a display unit 11, etc.

The contrast agent injecting device 5 injects contrast agents into the subject.

The transmitter 6 supplies current to the RF coil 24, and the gradient magnetic field power supply 7 supplies current to the gradient coil 23.

The receiver 8 performs signal processing such as detection on each signal received from the receiving coil 4.

The controller 9 controls the operations of respective parts of the MR apparatus 100 so as to realize various operations of the MR apparatus 100 such as transmission of information necessary for the display unit 11, reconstruction of an image based on data received from the receiver 8, etc. The controller 9 is configured by a computer, for example. The controller 9 has an image data generating unit 91 through a tracker region setting unit 97, etc. as shown in FIG. 1.

The image data generating unit 91 generates image data of an imaging region or part of the subject.

The center line setting unit 92 sets the center line of a body.

The correcting unit 93 corrects the center line of the body.

The CSF detecting unit 94 detects the position of cerebrospinal fluid.

The determining unit 95 determines a rotational angle θ of a window W (refer to FIGS. 10A and 10B) and its size. The window W will be described later.

The blood vessel detecting unit 96 detects the position of a blood vessel.

The tracker region setting unit 97 sets a tracker region for detecting a contrast agent The controller 9 is one example that configure the image data generating unit 91 through the tracker region setting unit 97. The controller 9 executes a predetermined program to thereby function as these units. The controller 9 is equivalent to a detecting apparatus.

The operation unit 10 is manipulated by an operator and inputs various information to the controller 9. The display unit 11 displays the various information thereon.

The MR apparatus 100 is configured as described above.

Figure 2:
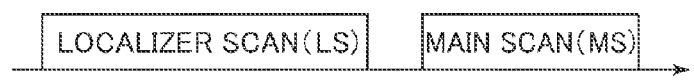
FIG. 2 is a diagram showing scans performed in the first embodiment.
Figure 3:
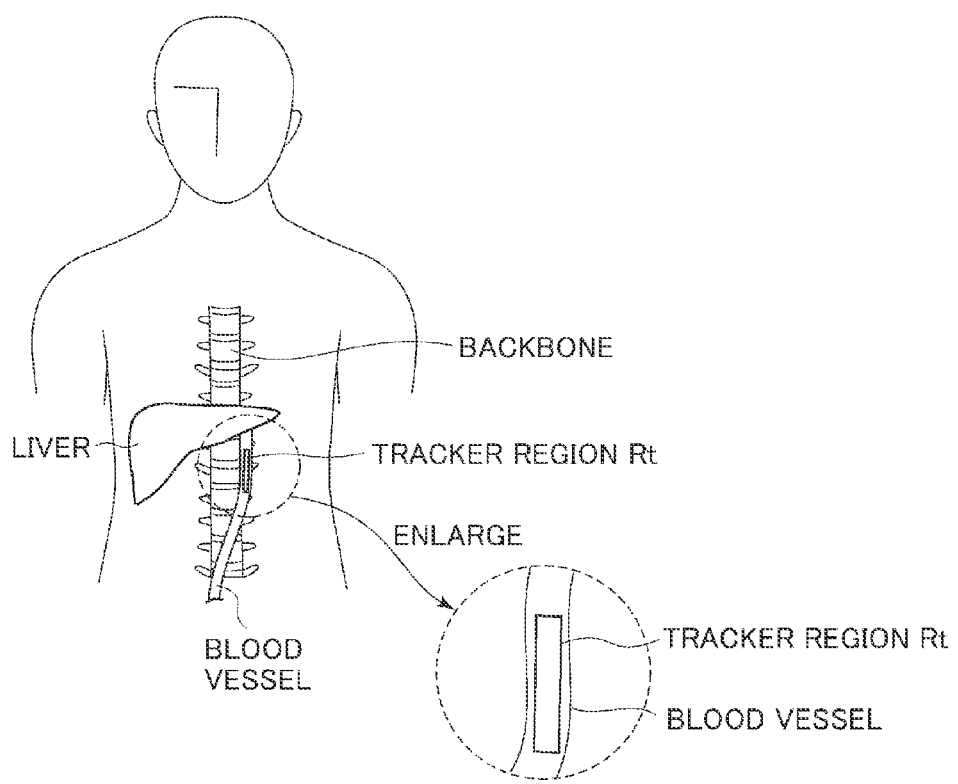
FIG. 3 is a diagram schematically illustrating a part to be imaged.

FIG. 2 is a diagram showing scans performed in the first embodiment, and FIG. 3 is a diagram schematically showing an imaging part.

In the first embodiment, a localizer scan LS and a main scan MS, etc. are performed.

The localizer scan LS is a scan for acquiring image data used when a slice position and a tracker region $R_t$ are set. The tracker region $R_t$ is a region for detecting a contrast agent.

In the main scan MS, when the contrast agent is injected into the subject and a predetermined amount of contrast agent reaches the tracker region $R_t$, a scan for acquiring image data of a region or part including the liver is performed. A flow taken when the localizer scan LS and the main scan MS are performed will hereinafter be described.

Figure 4:
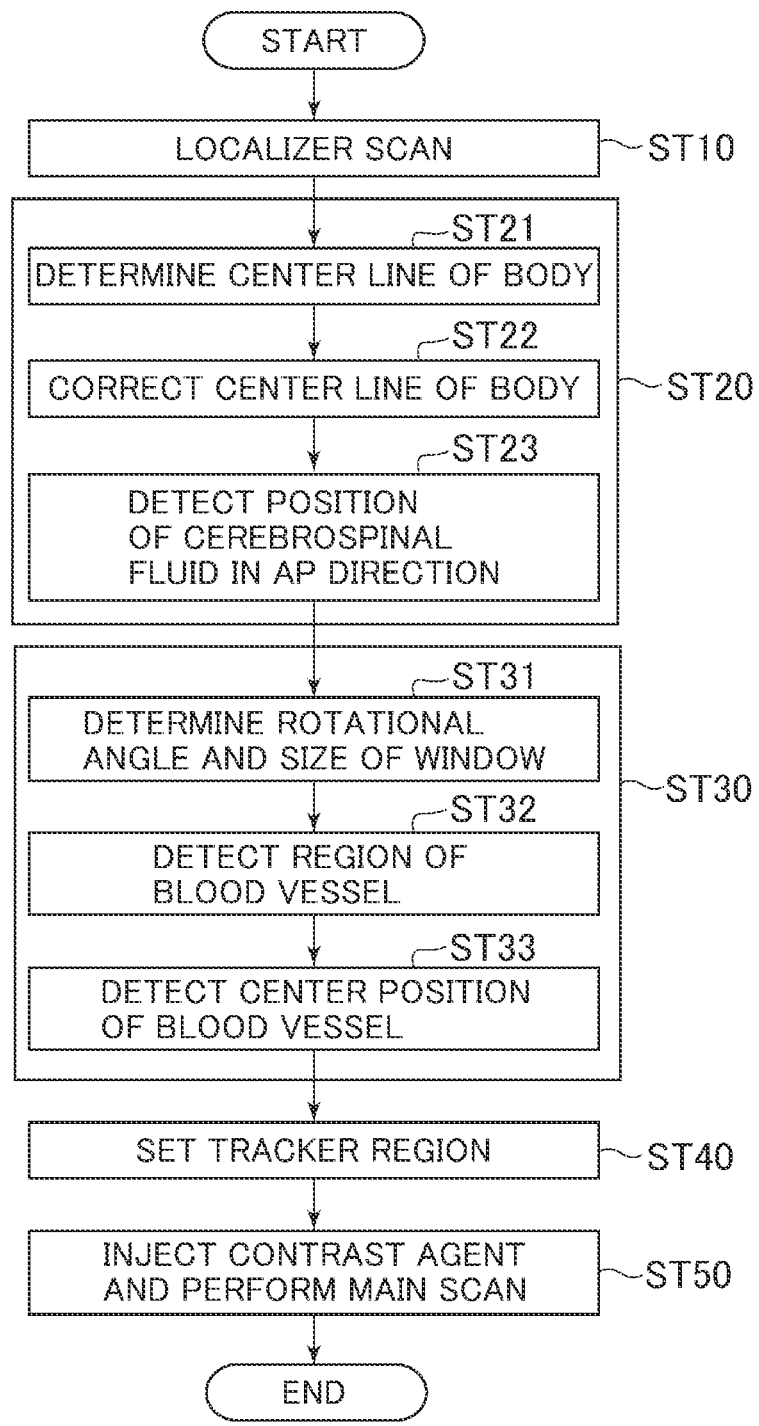
FIG. 4 is a diagram showing a flow taken when a subject is imaged in the first embodiment.

FIG. 4 is a diagram showing a flow taken when a subject is imaged in the first embodiment.

At step ST10, the localizer scan LS (refer to FIG. 2) is performed.

Figure 5:
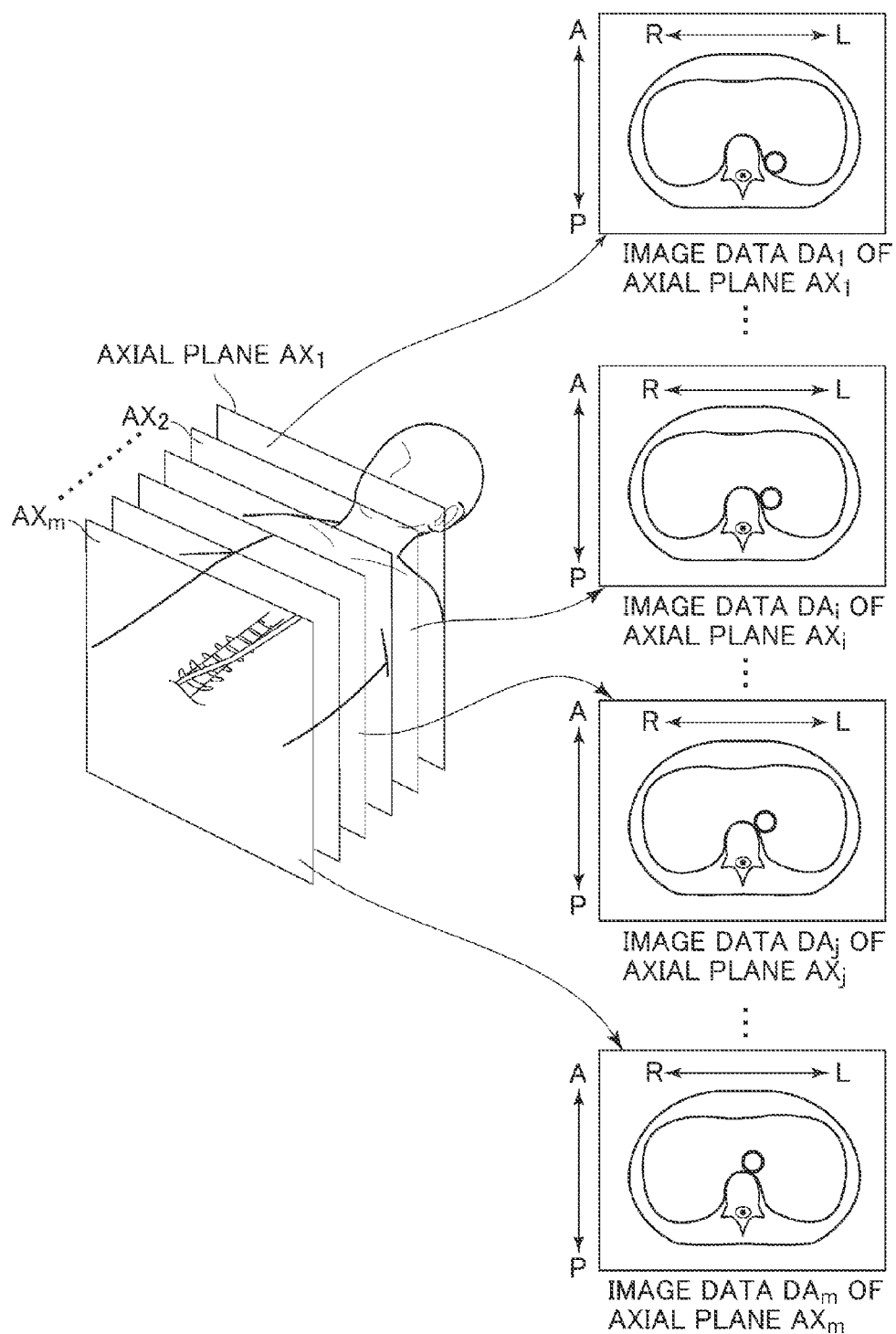
FIG. 5 is an explanatory diagram of a localizer scan LS.

FIG. 5 is a diagram for explaining the localizer scan LS.

In the localizer scan LS, a plurality of axial planes $AX_1$ through $AX_m$ that cross an abdominal region are scanned. The image data generating unit 91 (refer to FIG. 1) generates image data $DA_1$ through $DA_m$ of the axial planes $AX_1$ through $AX_m$, based on data acquired by the localizer scan LS. The image data of the axial planes will hereinafter be called "axial image data". In the first embodiment, the axial image data $DA_i$ through $DA_m$ are T2-emphasized image data but may be other image data (e.g., T1-emphasized data). After the generation of the axial image data $DA_1$ through $DA_M$, the flow proceeds to step ST20.

At step ST20, the position of cerebrospinal fluid CSF is detected from each of the axial image data $DA_1$ through $DA_m$. Since the step ST20 is comprised of substeps ST21 through ST23, the respective substeps ST21 through ST23 will be explained in order.

Figure 6:
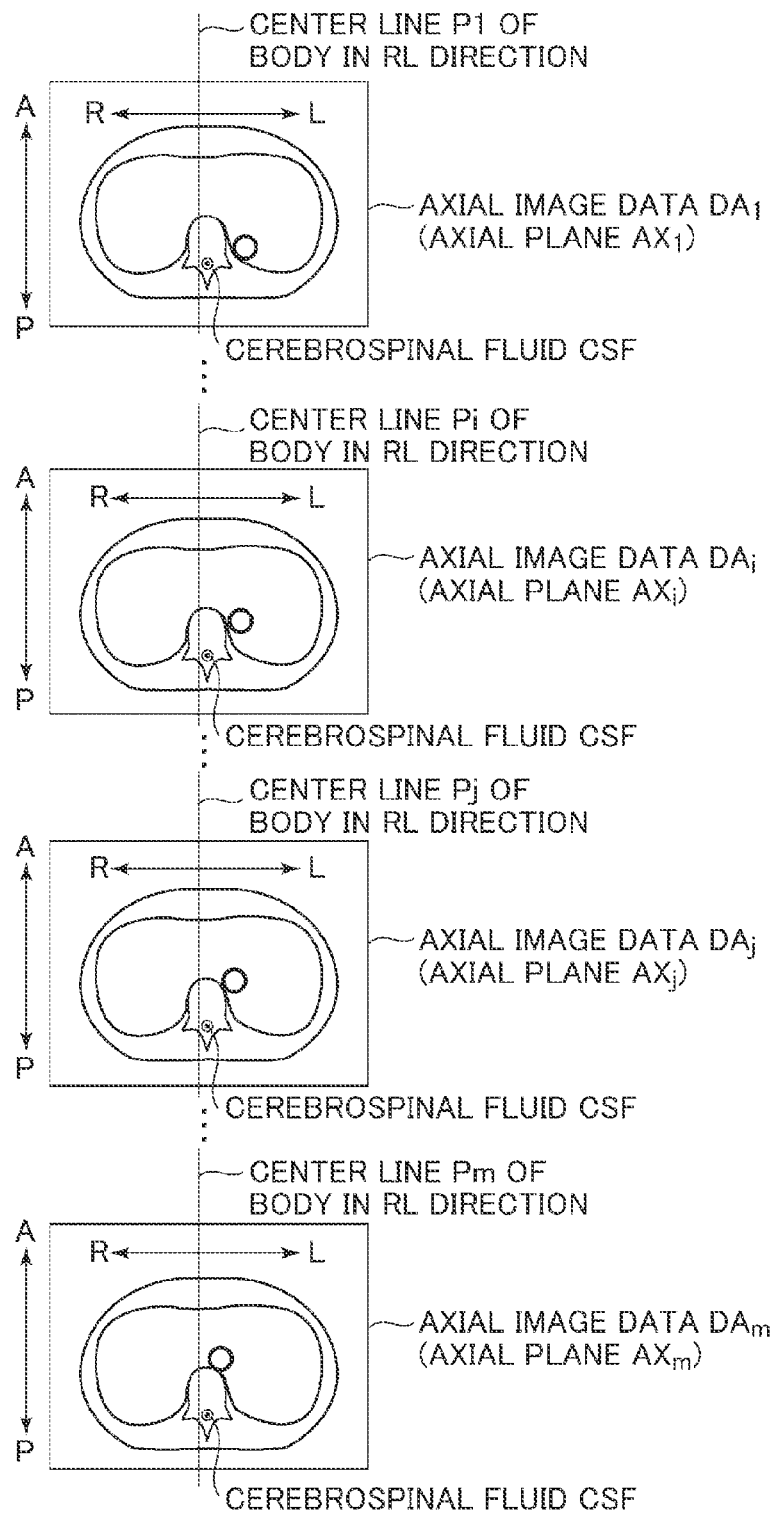
FIG. 6 is a diagram showing center lines $P_1$ through $P_m$ of a body.

At substep ST21, the center line setting unit 92 (refer to FIG. 1) sets center lines $P_1$ through $P_m$ each indicative of a center position in an RL direction, of a body of the subject for every $DA_1$ through $DA_m$ of the axial image data. The set center lines $P_1$ through $P_m$ thereof are schematically shown in FIG. 6. The center lines $P_1$ through $P_m$ are capable of, for example, bringing in vivo and vitro regions of the subject to segmentation from the respective axial image data $DA_1$ through $DA_m$ and thereby determining them as lines each of which passes through the middle between the right and left ends of the in vivo region. Since the cerebrospinal fluid CSF flows along the backbone of the subject, a rough position of the cerebrospinal fluid CSF as viewed in the RL direction can be determined by determining each of the center lines $P_1$ through $P_m$.

The center lines $P_1$ through $P_m$ do not however necessarily cross over the cerebrospinal fluid CSF. Therefore, the center lines $P_1$ through $P_m$ are corrected. In order to perform this correction, the flow proceeds to substep ST22.

At substep ST22, the correcting unit 93 (refer to FIG. 1) corrects the center lines $P_1$ through $P_m$ in such a manner that the center lines $P_1$ through $P_m$ go across the cerebrospinal fluid CSF. This correction method will be explained below. Incidentally, since any center line is the same in terms of the correction method, a method of taking up the center line $P_i$ of the center lines $P_1$ through $P_m$ and correcting the center line $P_i$ will be described below.

FIGS. 7A-7C, 8D, and 8E are respectively explanatory diagrams of the correction method of the center line $P_i$.

The correcting unit 93 first sets such a backbone region as to include the backbone onto the center line $P_i$.

Figure 7A:
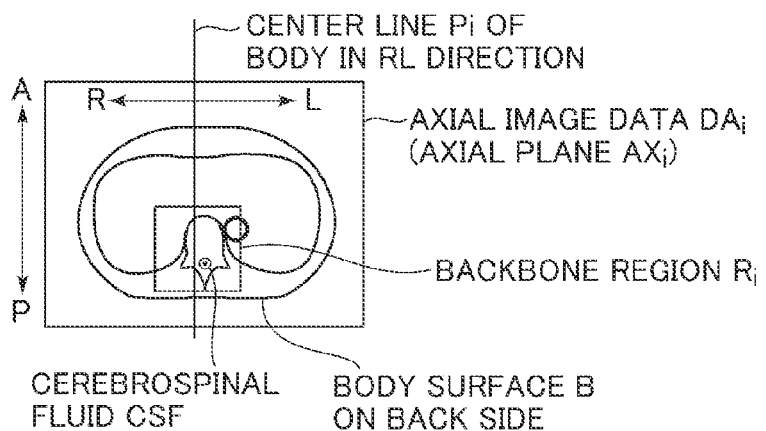
FIGS. 7A-7C are explanatory diagrams of a method for correcting the center line Pi.

FIG. 7A is a diagram showing the backbone region $R_i$ set onto the center line $P_i$.

Figure 7B:
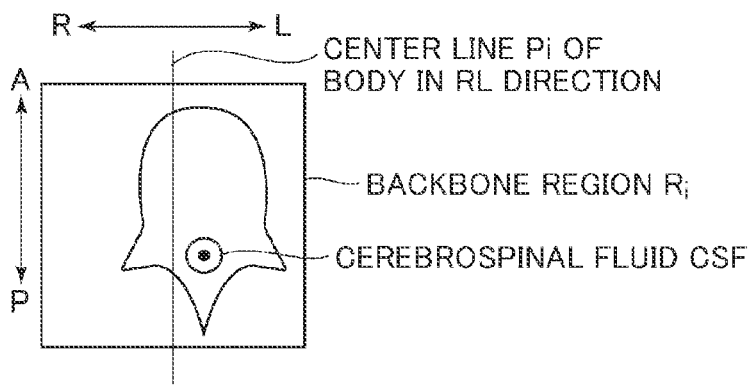
Figure 7C:
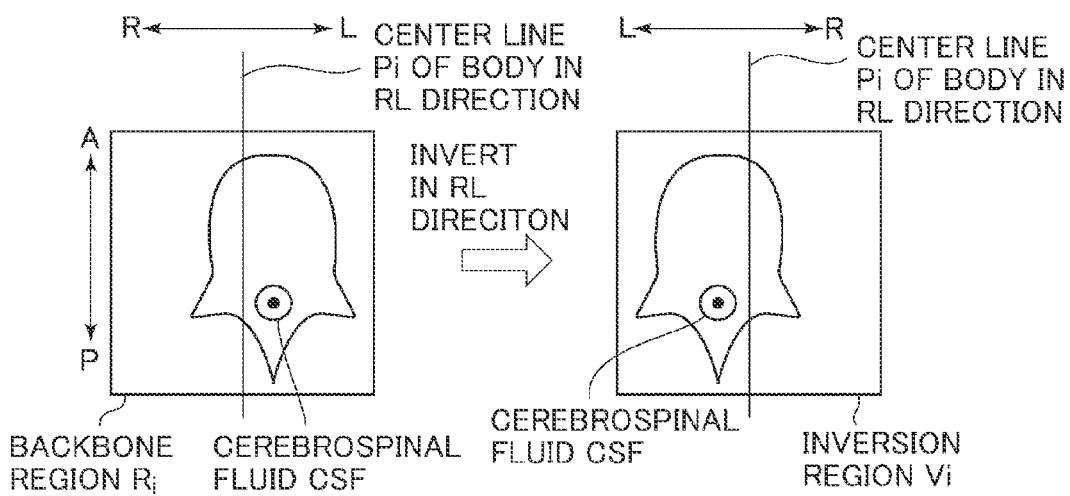

Since the center line $P_i$ is considered to cross a region lying inside the backbone or a region adjacent to the backbone, the backbone region $R_i$ can be set by taking the center line $P_i$ as a reference. Since, however, the position of the backbone region $R_i$ goes out of the backbone region $R_i$ when it gets too close to the abdomen side (A side) of the subject, the position of the backbone region $R_i$ is set to the back side (P side) of the subject. The axial image data $DA_i$ becomes large in signal value in the in vivo region but becomes small in signal value in the in vitro region. Therefore, each signal value is searched on the center line $P_i$ from the back side (P side), and a position where the signal value suddenly changes is detected, whereby the position of a body surface B on the back side of the subject can be detected. Thus, the region is set in such a manner that a range of a few cm (e.g., 5 cm) is included on the abdomen side (A side) from the position of the body surface B on the back side of the subject, thereby making it possible to set the backbone region $R_i$ so as to include the backbone. Incidentally, the width of the backbone region $R_i$ in the RL direction can be determined by reference to the width of the standard backbone in the RL direction. The width in the RL direction of the backbone region $R_i$ can be set to a few cm. After the setting of the backbone region $R_i$, the correcting unit 93 extracts the backbone region $R_i$. The extracted backbone region $R_i$ is shown in FIG. 7B. After the extraction of the backbone region $R_i$, the correcting unit 93 inverts the backbone region $R_i$ in the RL direction. An inversion region $V_i$ obtained by reversing the backbone region $R_i$ in the RL direction is schematically shown in FIG. 7C.

Figure 8D:
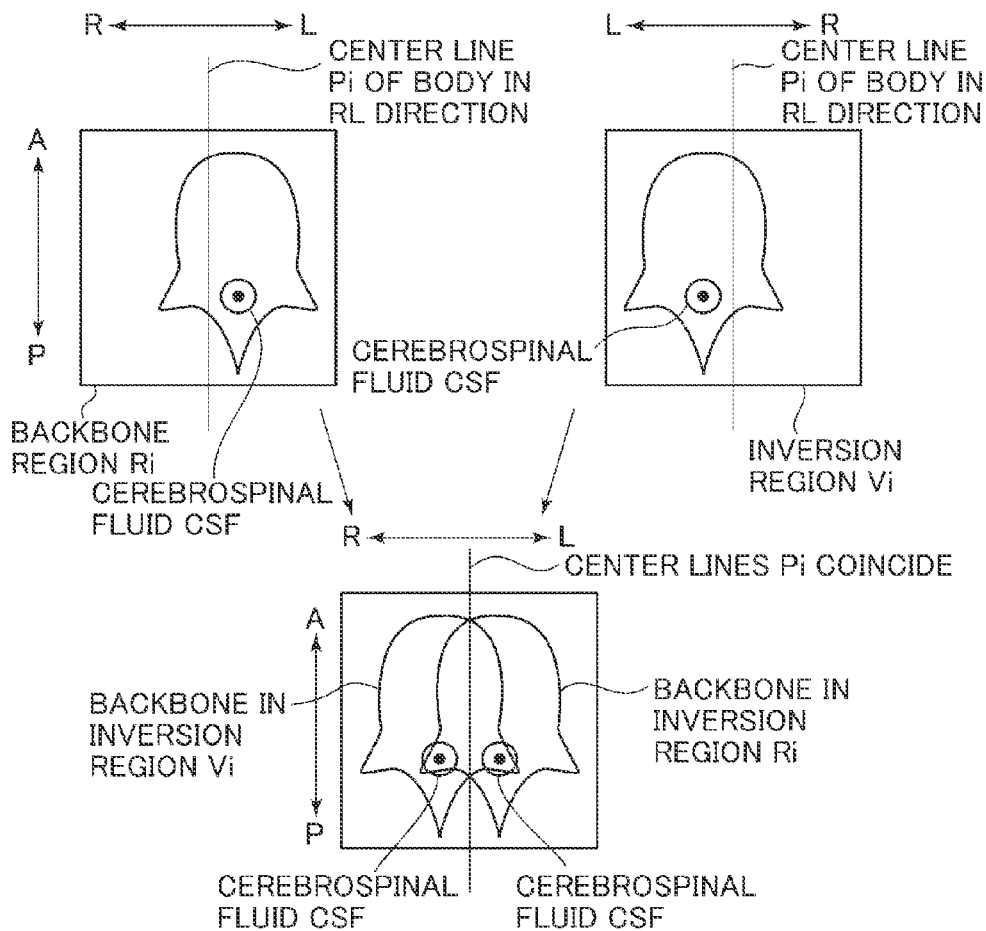
FIGS. 8D and 8E are explanatory diagrams of a method for correcting the center line $P_i$.
Figure 8E:
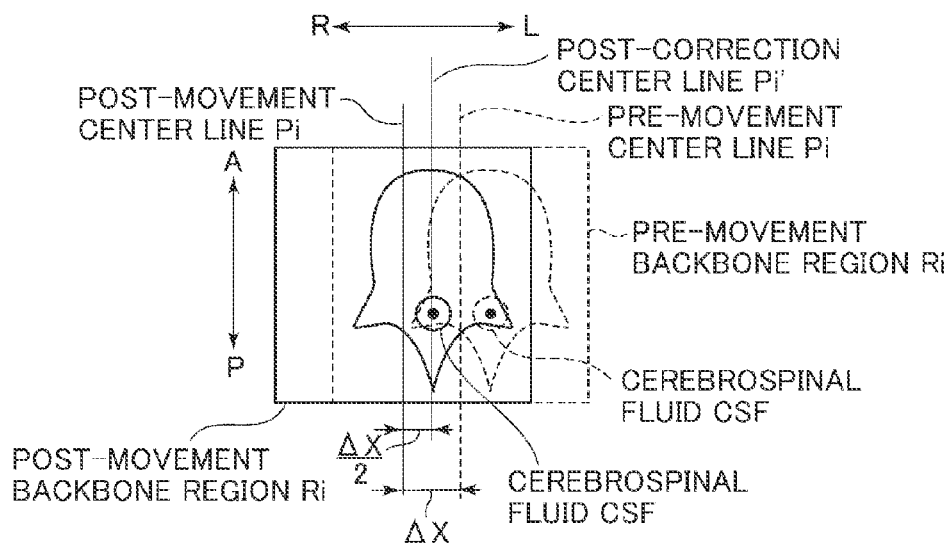

Next, the correcting unit 93 overlays the backbone region $R_i$ and the inversion region $V_i$ on each other in such a manner that the center line $P_i$ of the body in the backbone region $R_i$ and the center line $P_i$ of the body in the inversion region $V_i$ coincide with each other. FIG. 8D shows the manner in which the backbone region $R_i$ and the inversion region $V_i$ are overlaid on each other. After they have been overlaid on each other, the correcting unit 93 moves the backbone region $R_i$ in the RL direction to perform their alignment in such a manner that a displacement in position between the backbone in the backbone region $R_i$ and the backbone in the inversion region $V_i$ becomes minimum. FIG. 8E shows the manner after their alignment. The backbone region $R_i$ prior to being moved and the center line $P_i$ of the body are shown in broken lines in FIG. 8E. Now, assume that when the backbone region $R_i$ is moved by $\Delta x$ in the RL direction, the displacement in position between the backbone in the backbone region $R_i$ and the backbone in the inversion region $V_i$ has been brought to the minimum.

Figure 9:
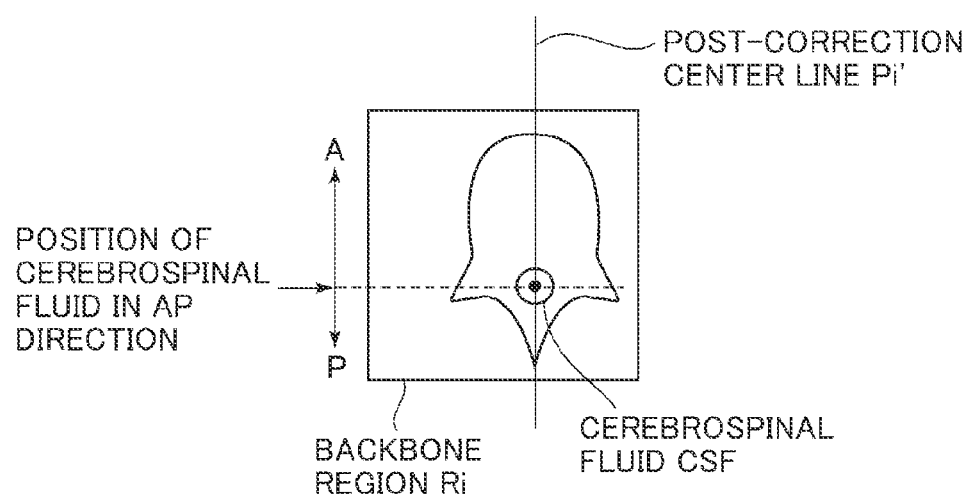
FIG. 9 is a diagram showing the position of cerebrospinal fluid CSF as viewed in an AP direction.

At substep ST23, the CSF detecting unit 94 (refer to FIG. 1) specifies the position of the cerebrospinal fluid CSF in the AP direction, based on a signal value on the post-correction center line $P_i'$. FIG. 9 shows the position of the cerebrospinal fluid CSF in the AP direction. In the first embodiment, the cerebrospinal fluid CSF is represented by a high signal where the axial image data $DA_1$ through $DA_m$ are of the T2-emphasized image data. Accordingly, the position of the cerebrospinal fluid CSF in the AP direction can be detected by detecting the position of the high signal from on the post-correction center line $P_i'$. Incidentally, as one example of its correction method, there is known a method of setting a window having n×m pixels onto the post-correction center line $P_i'$, moving the window on the post-correction center line $P_i'$ and detecting the position of the cerebrospinal fluid CSF, based on signal values in the window at respective movement positions thereof. As a method of detecting the position of the cerebrospinal fluid CSF, based on each signal value in the window, there are known a method which uses Adaboost that is one method of machine learning and used in a facial-recognition technique or the like, in the direction of the cerebrospinal fluid, a method of preparing template data of the cerebrospinal fluid and determining a correlation between the template data and data of the window at each movement position thereof, etc.

Thus, the center line $P_i$ of the body can be corrected so as to cross the cerebrospinal fluid CSF. The post-correction center line of the body is indicated by a symbol "$P_i'$"

Determining the post-correction center line $P_i'$ enables detection of the position of the cerebrospinal fluid CSF in the RL direction. Since, however, the post-correction center line $P_i'$ is a line parallel in an AP direction, it is not possible to detect up to the position of the cerebrospinal fluid CSF in the AP direction even if the post-correction center line $P_i'$ is determined Therefore, the flow proceeds to substep ST23 to detect the position of the cerebrospinal fluid CSF in the AP direction.

At substep ST23, the CSF detecting unit 94 (refer to FIG. 1) specifies the position of the cerebrospinal fluid CSF in the AP direction, based on a signal value on the post-correction center line $P_i'$. FIG. 9 shows the position of the cerebrospinal fluid CSF in the AP direction. As in the present embodiment, the cerebrospinal fluid CSF is represented by a high signal where the axial image data $DA_1$ through $DA_m$ are of the T2-emphasized image data. Accordingly, the position of the cerebrospinal fluid CSF in the AP direction can be detected by detecting the position of the high signal from on the post-correction center line $P_i'$. Incidentally, as one example of its correction method, there is known a method of setting a window having n×m pixels onto the post-correction center line $P_i'$, moving the window on the post-correction center line $P_i'$ and detecting the position of the cerebrospinal fluid CSF, based on signal values in the window at respective movement positions thereof. As a method of detecting the position of the cerebrospinal fluid CSF, based on each signal value in the window, there are known a method which uses Adaboost that is one method of machine learning and used in a facial-recognition technique or the like, in the direction of the cerebrospinal fluid, a method of preparing template data of the cerebrospinal fluid and determining a correlation between the template data and data of the window at each movement position thereof, etc.

The position of the cerebrospinal fluid at the axial image data $DA_i$ can be detected in this manner Though the axial image data $DA_i$ has been taken in the above description, the position of the cerebrospinal fluid is detected in a similar procedure even with respect to other axial image data. After the position of the cerebrospinal fluid CSF has been detected for every $DA_1$ through $DA_m$ of axial image data, the flow proceeds to step ST30.

At step ST30, a blood vessel located in the neighborhood of the backbone is detected for every $DA_1$ through $DA_m$ of axial image data. Since the step ST30 is made up of substeps ST31 through ST33, the respective substeps ST31 through ST33 will be described in order.

Incidentally, since any axial image data is the same in terms of a method of detecting the blood vessel, a description will hereinafter be made of a method of taking up the axial image data $DA_i$ and thereby detecting the position of a blood vessel.

At substep ST31, the position and size of a window used to detect the position of the blood vessel is determined with the position of the cerebrospinal fluid CSF as a reference. A method of determining the position and size of the window will hereinafter be described while referring to FIGS. 10A and 10B.

Figure 10:
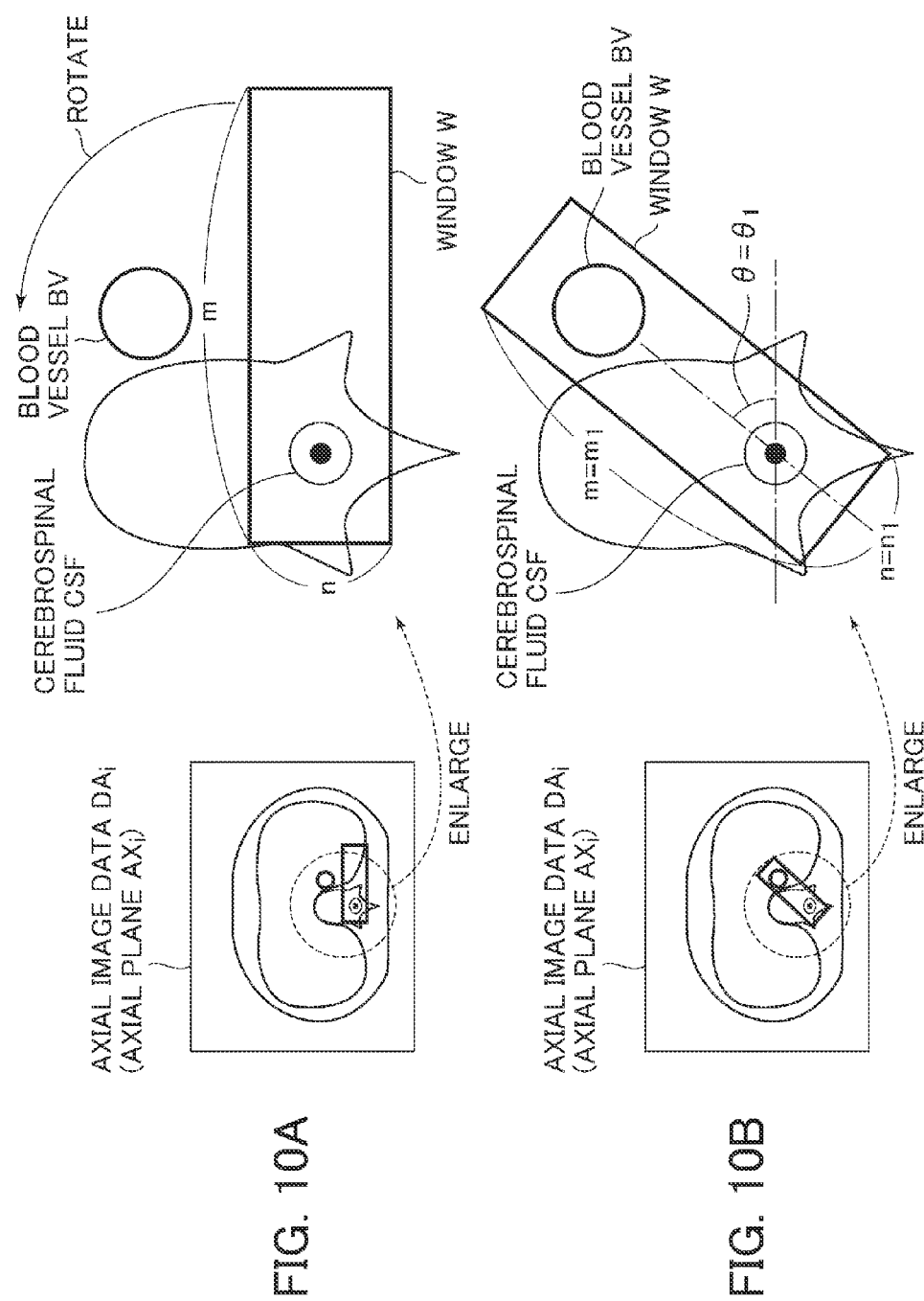
FIGS. 10A and 10B are diagrams showing a window W.

The determining unit 95 (refer to FIG. 1) sets a window W having n×m pixels with the cerebrospinal fluid CSF as the reference (refer to FIG. 10A). Next, the determining unit 95 rotates the window W centering on the cerebrospinal fluid CSF and further changes the size (value of n and value of m) of the window W. Then, the determining unit 95 determines a rotational angle θ of the window W and its size (value of n and value of m) when the entire section of a blood vessel BV is included inside the window W. FIG. 10B shows the rotational angle θ of the window W and its size (value of n and value of m) when the entire section of the blood vessel BV is included inside the window W. In FIG. 10B, the rotational angle θ=θ1, n=n1, and m=m1.

As a method of determining whether the entire section of the blood vessel BV is included inside the window W, there are known a method which uses Adaboost that is one method of machine learning, a method of preparing template data of each blood vessel and determining a correlation between the template data and data of the window W, etc. After the determination of the rotational angle θ=θ1, n=n1 and m=m1, the flow proceeds to substep ST32.

At substep ST32, a region of the blood vessel BV is detected from a region lying inside the window W.

Figure 11:
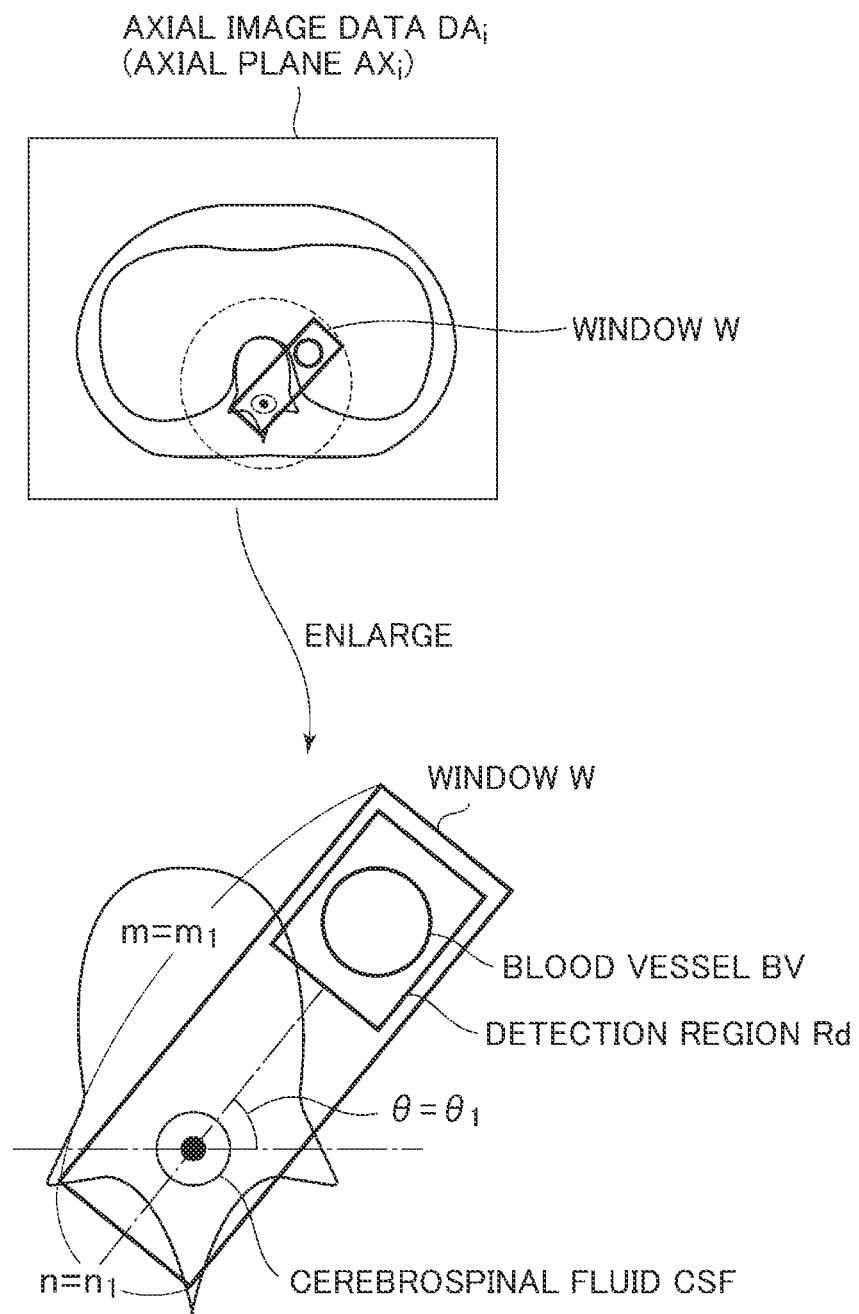
FIG. 11 is an explanatory diagram used when a region of a blood vessel is detected.
Figure 12:
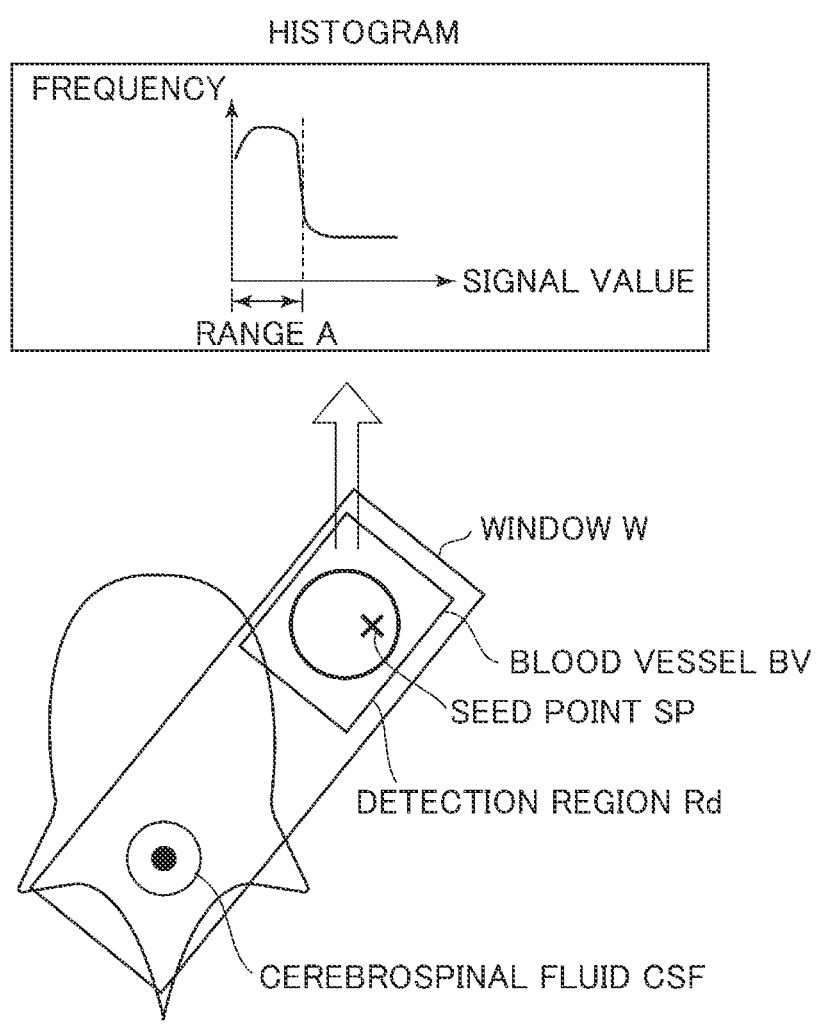
FIG. 12 is an explanatory diagram used when the region of the blood vessel is detected.

FIGS. 11 and 12 are respectively explanatory diagrams taken when the region of the blood vessel is detected.

The blood vessel detecting unit 96 (refer to FIG. 1) first sets the rotational angle θ of the window W to θ=θ1 and sets the size of the window W to n=n1 and m=m1, as shown in FIG. 11.

Next, the blood vessel detecting unit 96 sets a detection region Rd for detecting the region of the blood vessel to the blood vessel BV side in the window W. In the present embodiment, it has been known that the cerebrospinal fluid CSF is located on one end side of the window W, and the blood vessel BV is located on the other end side thereof. Thus, the detection region Rd is set to the other end side of the window W, thereby making it possible to set the detection region Rd so as to include the blood vessel BV. In the present embodiment, if the detection region Rd is capable of including the blood vessel BV though being square, the detection region Rd may be those (e.g., a rectangle and an ellipse) other than the square. After the setting of the detection region Rd, a seed point for detecting the region of the blood vessel BV is set to the inside of the blood vessel BV.

FIG. 12 is an explanatory diagram taken when the seed point for detecting the region of the blood vessel BV is set.

The blood vessel detecting unit 96 first generates a histogram indicative of a relation between a signal value of each pixel in the detection region Rd and its frequency. Since the blood vessel BV is a low signal, a large number of pixels small in signal value are included in the detection region Rd. Accordingly, a range A in which the frequency becomes large appears on the low signal side of the histogram. Since the blood vessel BV is of the low signal as described above, there is considered a high possibility that pixels whose signal values are included in the range A will be pixels located inside the blood vessel BV. Thus, the blood vessel detecting unit 96 selects any of the pixels included in the range A and determines the selected pixel to be a seed point SP.

Figure 13:
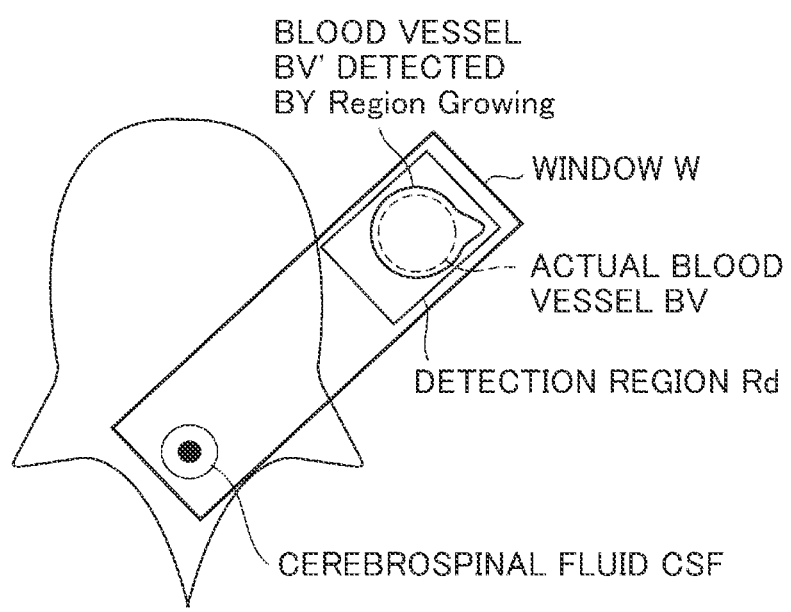
FIG. 13 is a diagram showing an example where a peripheral portion of the blood vessel is detected as part of the blood vessel.

After the determination of the seed point SP, Region Growing is performed aiming at the pixels included in the range A with the seed point SP as the reference. It is thus possible to detect the region of the blood vessel BV. Incidentally, when the region of the blood vessel is detected by Region Growing, a part around the blood vessel might be detected as part of the blood vessel. FIG. 13 shows one example of a case where a part around a blood vessel is detected as part of the blood vessel. In FIG. 13, a range wider than an actual blood vessel BV is detected as a blood vessel BV'. In such a case, a region of the actual blood vessel BV may be detected using a method such as Active Contour.

After the detection of the region of the blood vessel, the flow proceeds to step ST33.

Figure 14:
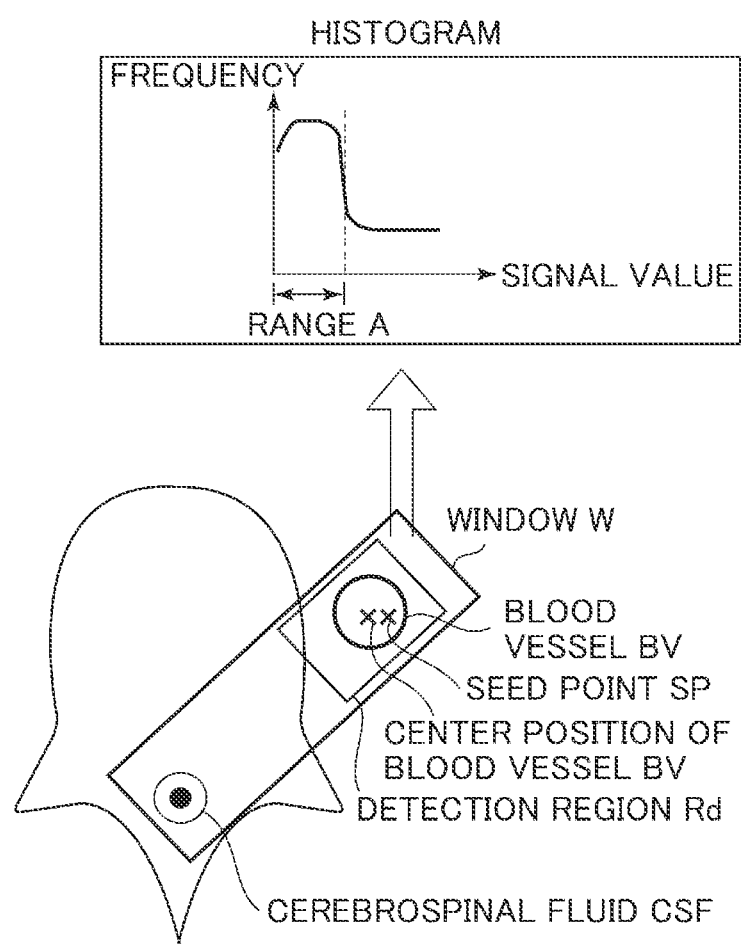
FIG. 14 is a diagram showing the position of center of a blood vessel BV.

At step ST33, the blood vessel detecting unit 96 detects a center position of the blood vessel BV from within the detected region of blood vessel BV. The center position of the blood vessel BV is shown in FIG. 14. Since the sectional shape of the blood vessel BV is assumed to be nearly circular, a pixel located in the center of the blood vessel is specified from within the detected region of blood vessel BV, thereby making it possible to detect the center position of the blood vessel BV.

Figure 15:
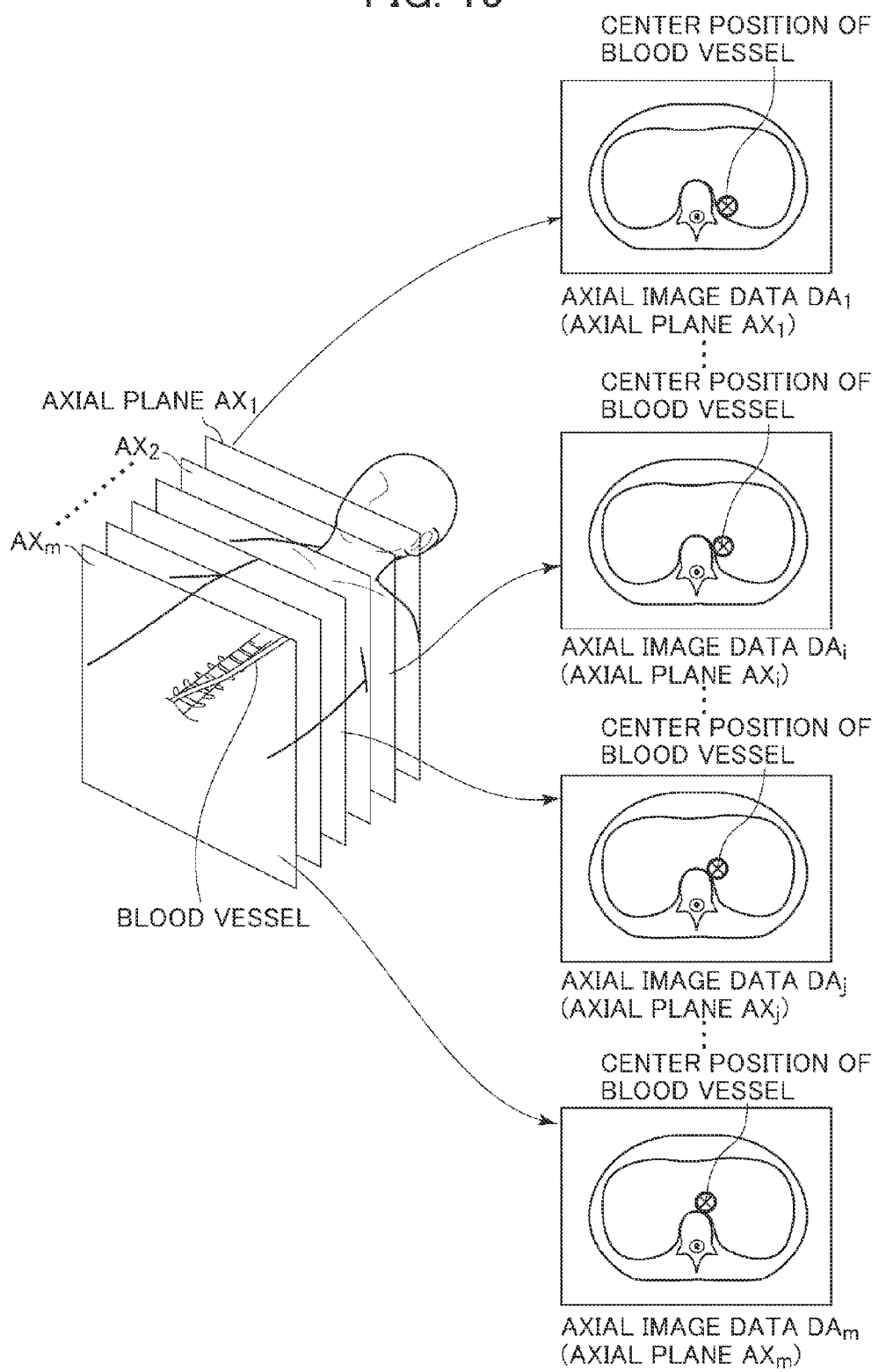
FIG. 15 is a diagram schematically illustrating the center position of a blood vessel, detected with respect to each of axial image data $DA_1$ through $DA_m$.

It is possible to detect the center position of the blood vessel at the axial image data $DA_i$ in this manner. While the axial image data $DA_i$ has been taken up in the above description, the center position of the blood vessel can be detected in a similar procedure even with respect to other axial image data. Center positions of a blood vessel, which have been detected with respect to the axial image data $DA_1$ through $DA_m$, are schematically shown in FIG. 15. After the detection of the center positions of the blood vessel, the flow proceeds to step ST40.

Figure 16:
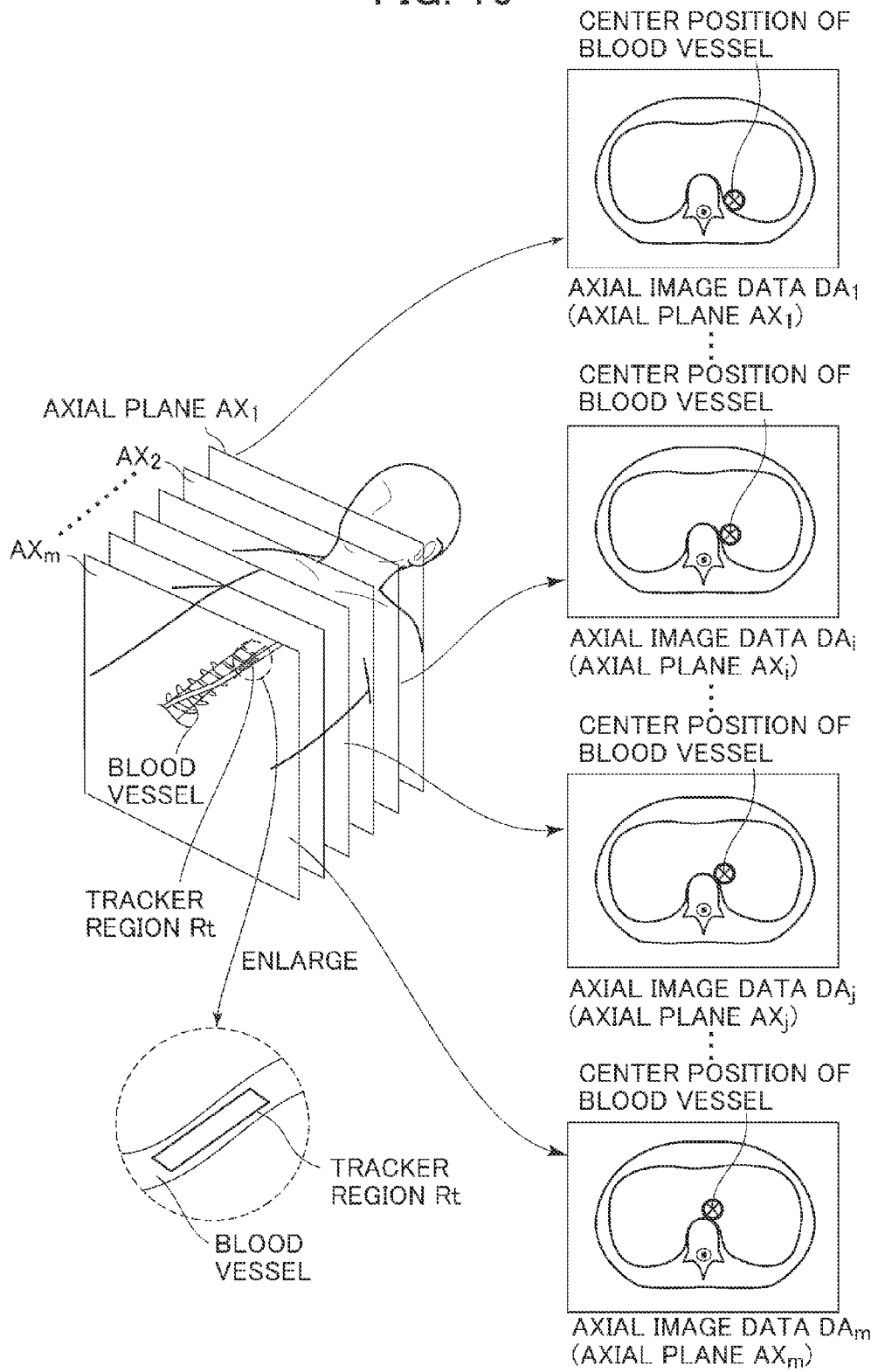
FIG. 16 is a diagram schematically showing a tracker region $R_t$.

At step ST40, the tracker region setting unit 97 (refer to FIG. 1) sets a tracker region for detecting a contrast agent, based on the detected center positions of the blood vessel. The set tracker region $R_t$ is schematically shown in FIG. 16. The tracker region $R_t$ is set so as to include the center positions of the blood vessel, which have been detected for every $DA_1$ through $DA_m$ of axial image data. After the tracker region $R_t$ has been set, the flow proceeds to step ST50.

At step ST50, the main scan MS (refer to FIG. 2) is performed. In the main scan MS, a contrast agent is injected into the subject, and a sequence for detecting the contrast agent from the tracker region $R_t$ is repeatedly performed. When a predetermined amount of contrast agent is injected into the tracker region $R_t$, a scan for acquiring image data of the liver is performed, and the flow is terminated.

In the first embodiment, the cerebrospinal fluid CSF is detected before the blood vessel BV is detected. Since the cerebrospinal fluid CSF is represented by the high signal, the cerebrospinal fluid CSF can easily be detected. Next, the rotational angle θ=θ1 of the window W and its size (n=n1 and m=m1) taken when the blood vessel BV is included in the window W, are determined while changing the rotational angle of the window W and its size centering on the cerebrospinal fluid CSF. Then, the position of the blood vessel is detected from within the window W set to the rotational angle θ1, n=n1 and m=m1. Thus, the position of the blood vessel can be detected in a short period of time as compared with the method of detecting the position of a blood vessel while shifting the position of the window W over the entire axial image data $DA_1$ through $DA_m$.

Incidentally, in the first embodiment, the rotational angle θ of the window W, and the size of the window W are changed. Only the rotational angle θ of the window W may however be changed with its size being fixed.

Although the position of the blood vessel BV has been detected with the position of the cerebrospinal fluid CSF as the reference in the first embodiment, the position of the blood vessel BV may be detected with a position different from that of the cerebrospinal fluid CSF being taken as the reference. Although the position of the blood vessel BV has been detected in the first embodiment, the systems and methods described herein can be applied even to the case where a region or part separate from the blood vessel BV is detected.

Although the position of the blood vessel has been detected based on the axial image data in the first embodiment, the position thereof may be determined based on image data of planes (e.g. oblique planes each crossed obliquely with respect to the axial plane) different from the axial planes.

In the first embodiment, the window W includes the cerebrospinal fluid CSF. If, however, the position of the blood vessel BV can be detected, the cerebrospinal fluid CSF may be out of the window W. Though the window W is rectangular, it may be another shape (e.g. elliptical shape).

(2) Second Embodiment

Figure 17:
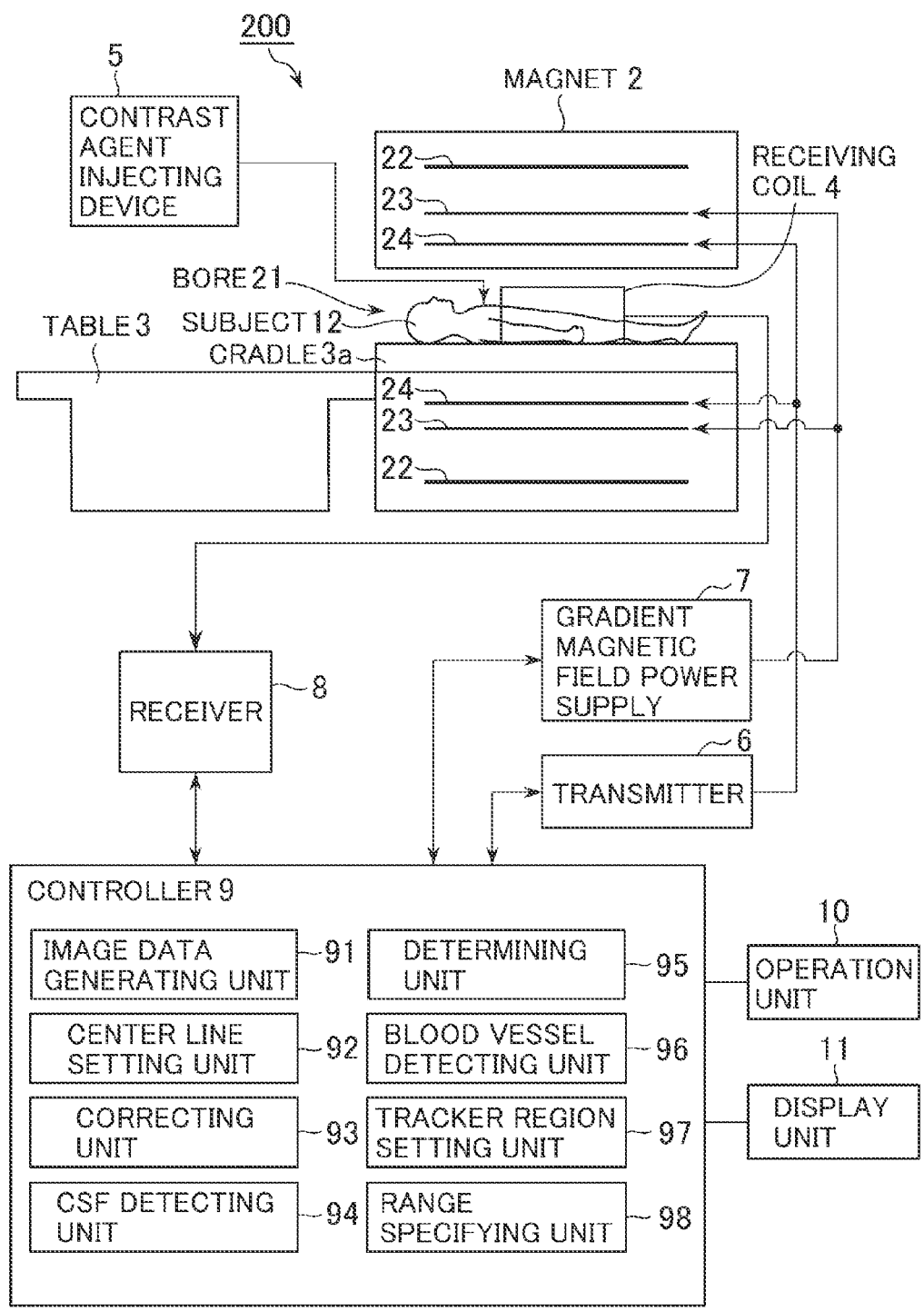
FIG. 17 is a schematic diagram of an MR apparatus according to a second embodiment.

FIG. 17 is a schematic diagram of an MR apparatus according to a second embodiment.

In the MR apparatus 200 according to the second embodiment, a controller 9 is equipped with a range specifying unit 98 for specifying a range of an in vivo region of a subject as viewed in an RL direction. Incidentally, the second embodiment is identical in other configuration to the first embodiment.

Figure 18:
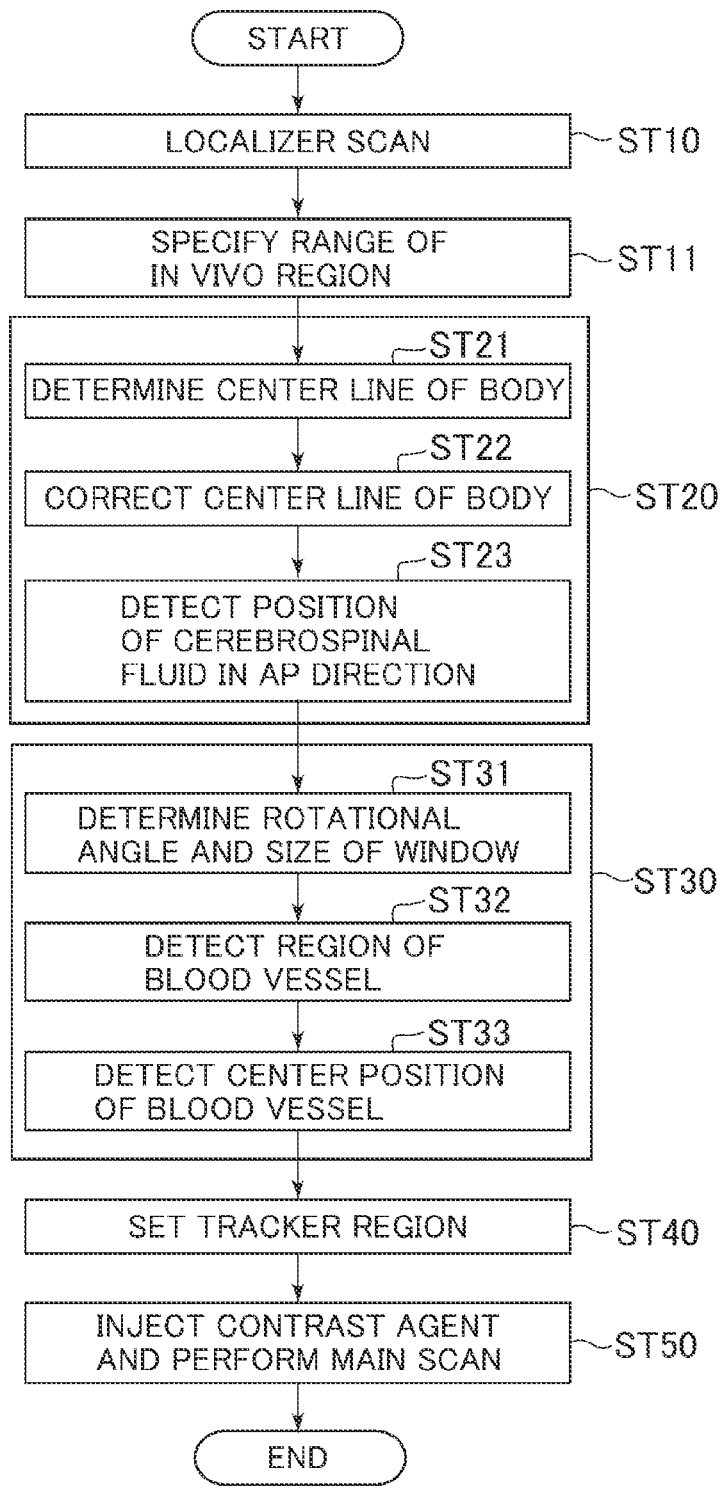
FIG. 18 is a diagram showing an operation flow of the MR apparatus 200 according to the second embodiment.

FIG. 18 is a diagram showing an operation flow of the MR apparatus 200 according to the second embodiment.

At step ST1, a localizer scan LS is performed. Axial image data $DA_1$ through $DA_m$ (refer to FIG. 5) are obtained by performing the localizer scan LS. After the localizer scan LS has been performed, the operation flow proceeds to step ST11.

At step ST11, the range specifying unit 98 (refer to FIG. 17) specifies the range of the in vivo region of the subject as viewed in the RL direction, based on each of the axial image data $DA_1$ through $DA_m$.

Figure 19:
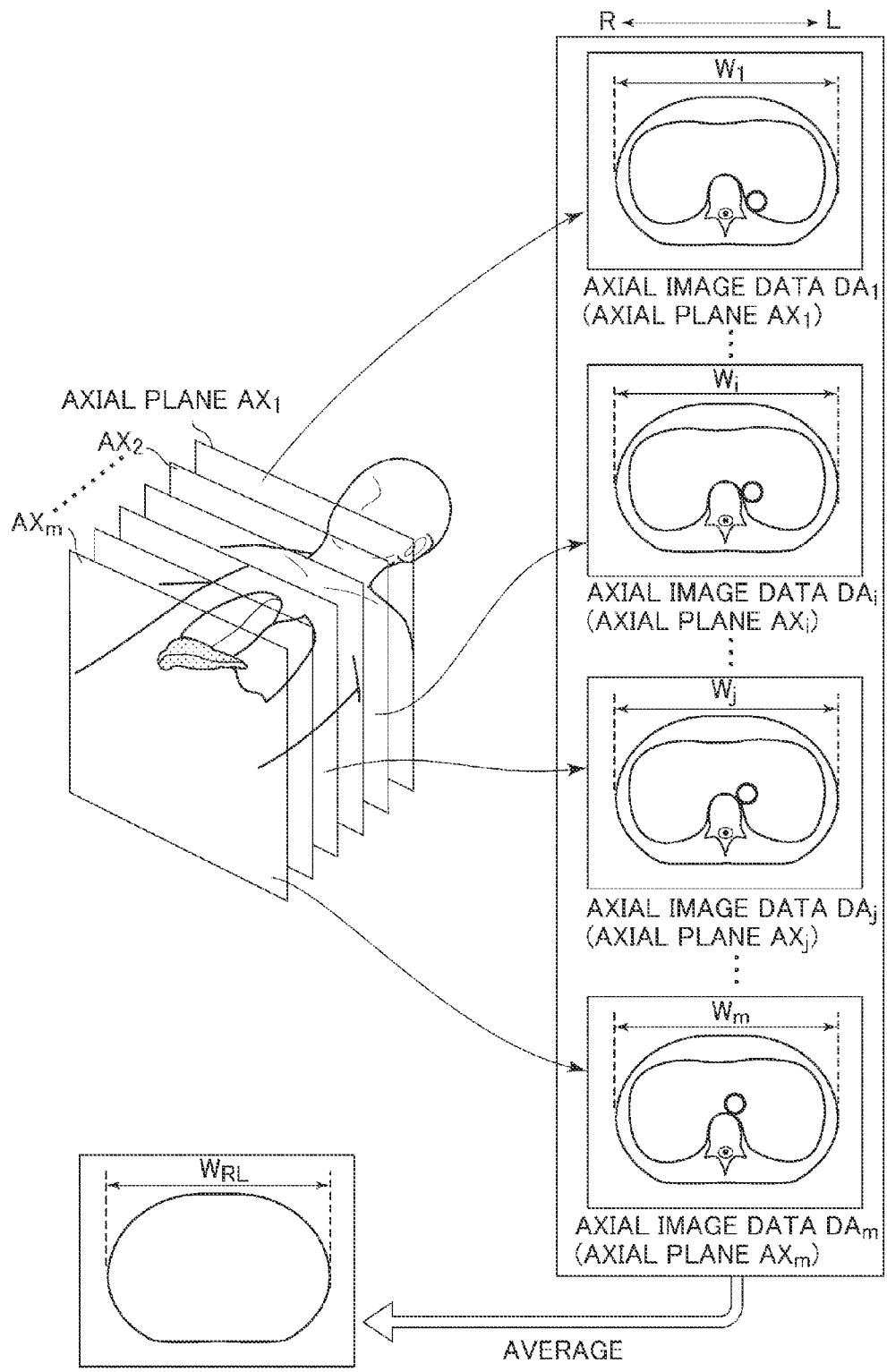
FIG. 19 is an explanatory diagram taken when a range in an RL direction, of a body region of a subject is specified.

FIG. 19 is an explanatory diagram taken when each range of the in vivo region of the subject as viewed in the RL direction is specified.

The range specifying unit 98 first determines ranges $W_1$ through $W_m$ in the RL direction, of the in vivo region of the subject at respective axial planes $AX_1$ through $AX_m$. Since the in vitro region of the subject is a low signal but the in vivo region thereof is a high signal, the ranges $W_1$ through $W_m$ in the RL direction of the in vivo region of the subject can be determined for every $AX_1$ through $AX_m$ of axial planes due to the difference in signal value. The range specifying unit 98 calculates an average value of lengths of these ranges $W_1$ through $W_m$ in the RL direction and assumes a range defined by this average value to be a range $W_{RL}$ of the in vivo region of the subject as viewed in the RL direction. Thus, the range $W_{RL}$ in the RL direction of the in vivo region of the subject is specified. Incidentally, any of the ranges $W_1$ through $W_m$ may be taken as the range $W_{RL}$ in the RL direction of the in vivo region of the subject. After the range $W_{RL}$ has been specified, steps ST20 and ST30 are performed.

At step ST20, the position of cerebrospinal fluid CSF is detected as with the first embodiment. In the second embodiment, however, the range in which the cerebrospinal fluid CSF is detected is limited to the RL-direction range $W_{RL}$ of the in vivo region of the subject, which has been specified at step ST11. Limiting the detection range of the cerebrospinal fluid CSF to $W_{RL}$ makes it possible to prevent the cerebrospinal fluid from being detected from the in vitro region.

At step ST30, the position of a blood vessel BV is detected as with the first embodiment. In the second embodiment, however, a range in which the blood vessel BV is detected is limited to the RL-direction range $W_{RL}$ of the in vivo region of the subject, which has been specified at step ST11. Limiting the detection range of the blood vessel BV to $W_{RL}$ enables prevention of the blood vessel from being detected from the in vitro region.

After the detection of the position of the blood vessel, steps ST40 and ST50 are performed, and the flow is terminated.

Even in the second embodiment, the position of the blood vessel can be detected in a short period of time as with the first embodiment. It is possible to fully reduce the risk of the cerebrospinal fluid and the blood vessel being detected from the in vitro region.

(3) Third Embodiment

Figure 20:
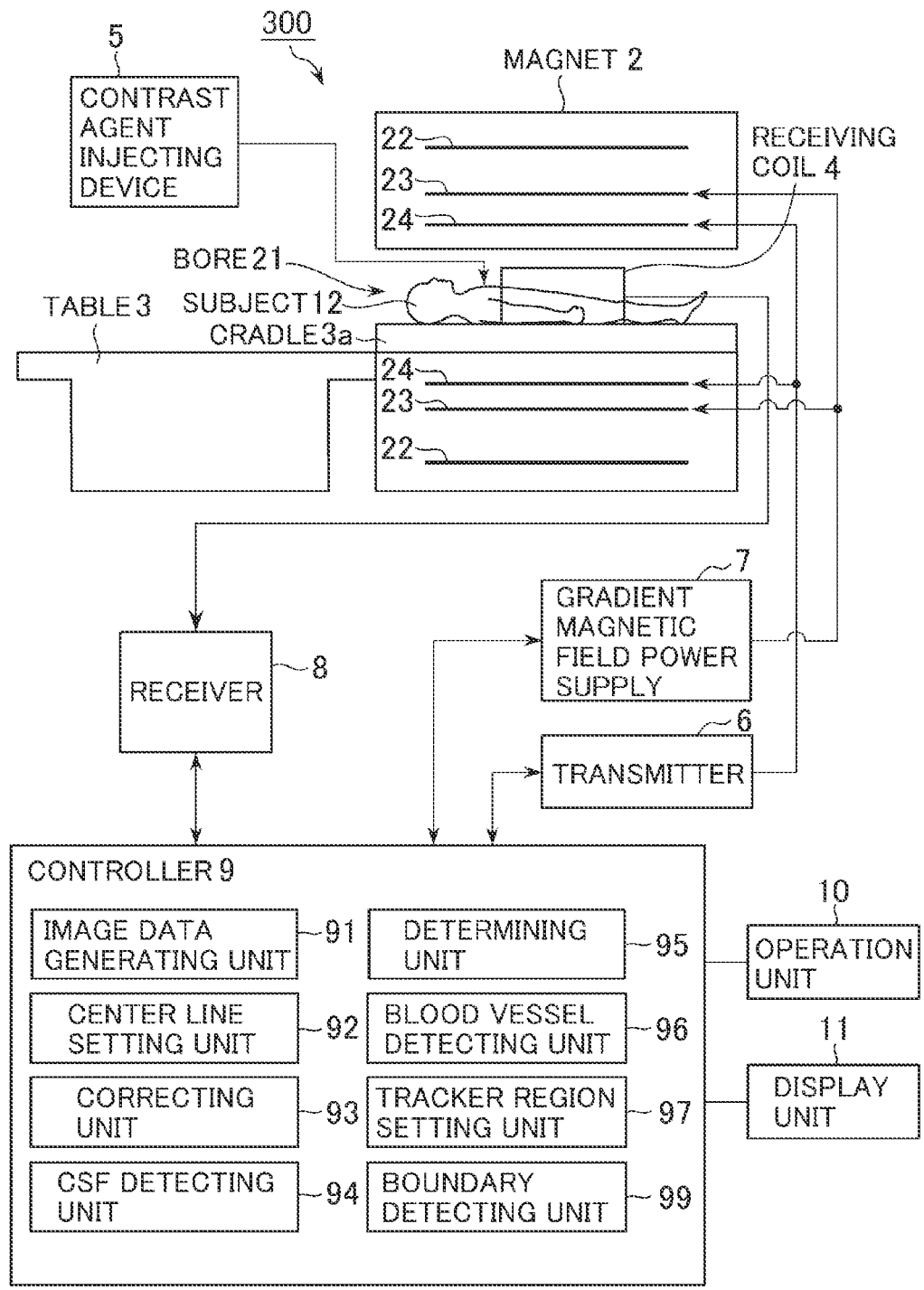
FIG. 20 is a schematic diagram of an MR apparatus according to a third embodiment.

FIG. 20 is a schematic diagram of an MR apparatus according to a third embodiment.

In the MR apparatus 300 according to the third embodiment, a controller 9 is equipped with a boundary detecting unit 99 for detecting the boundary between the liver and the lung. Incidentally, the third embodiment is identical in other configuration to the first embodiment.

Figure 21:
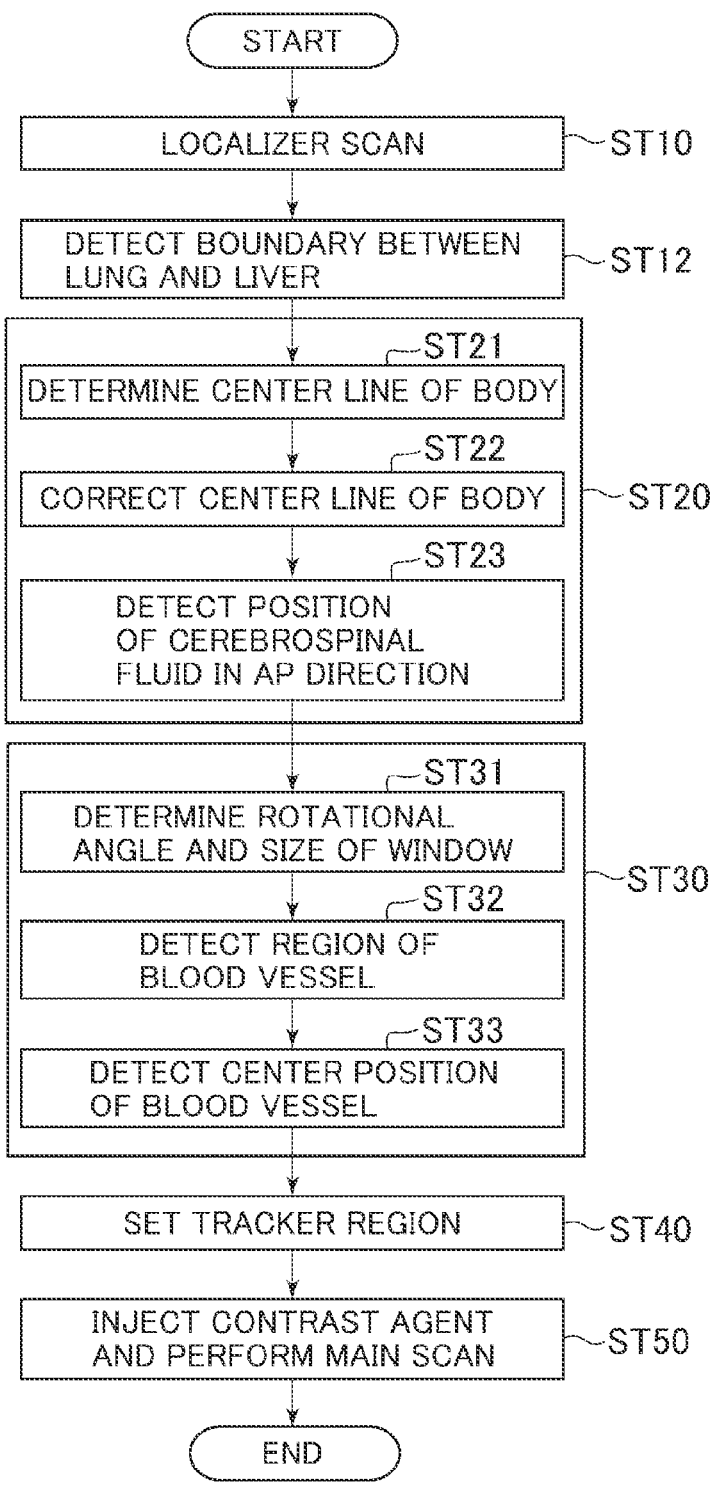
FIG. 21 is a diagram illustrating an operation flow of the MR apparatus 300 according to the third embodiment.

FIG. 21 is a diagram showing an operation flow of the MR apparatus 300 according to the third embodiment.

At step ST10, a localizer scan LS is performed.

Figure 22:
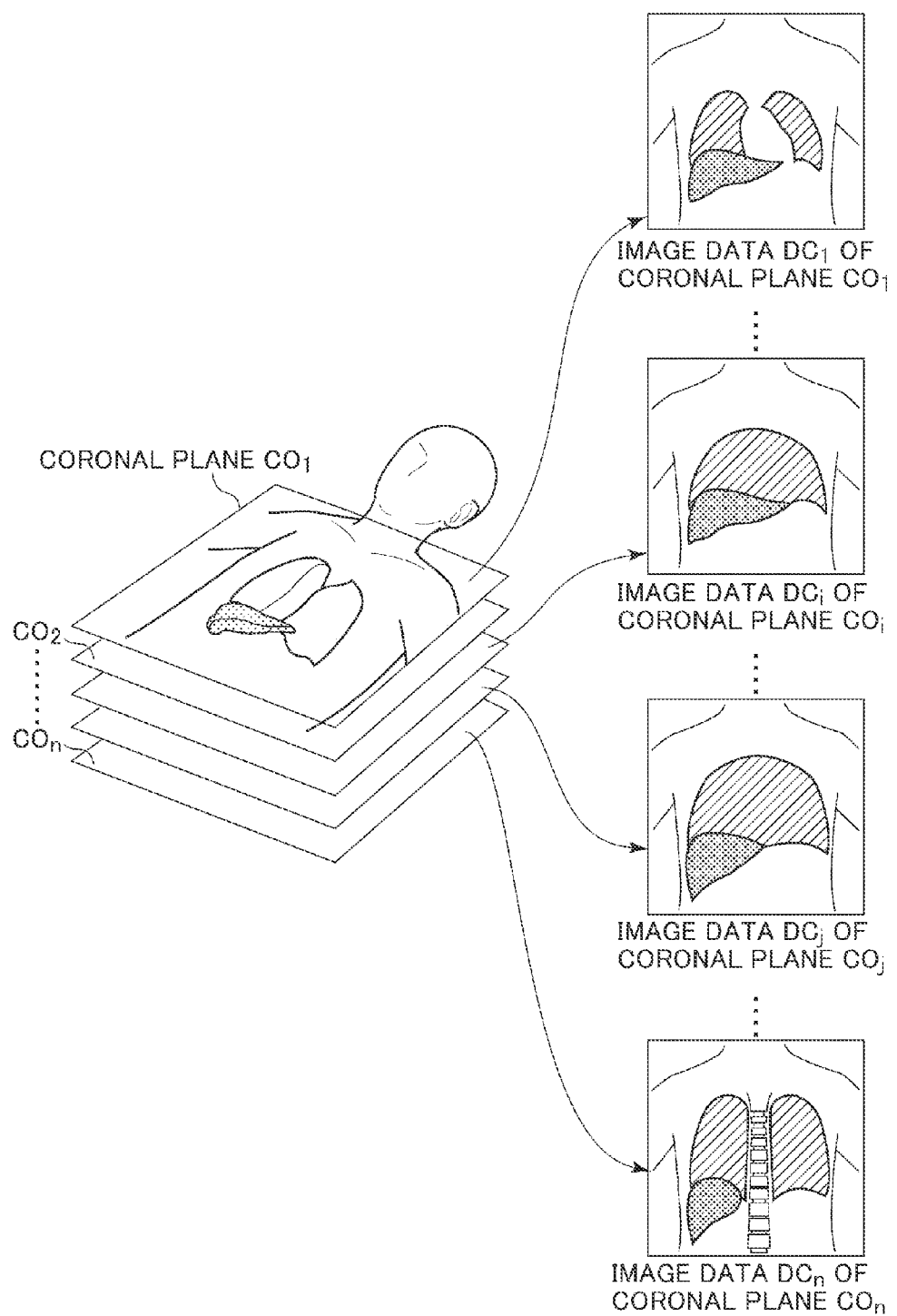
FIG. 22 is an explanatory diagram taken when coronal planes are scanned.

While in the first embodiment, only the scan of the axial planes $AX_1$ through $AX_m$ has been performed where the localizer scan LS is performed (refer to FIG. 5), the scan of coronal planes is also performed as well as the scan of the axial planes $AX_1$ through $AX_m$ (refer to FIG. 22).

FIG. 22 is an explanatory diagram taken when the coronal planes are scanned.

An image data generating unit 91 (refer to FIG. 20) generates image data $DC_1$ through $DC_n$ of coronal planes CO1 through Con, based on data acquired by scanning the coronal planes $CO_1$ through $CO_n$. Incidentally, the image data of the coronal planes will be called "coronal image data" below.

It is possible for the third embodiment to acquire the coronal image data $DC_1$ through $DC_n$ as well as axial image data $DA_1$ through $DA_m$ by the localizer scan LS. After the localizer scan has been performed, the operation flow proceeds to step ST12.

Figure 23:
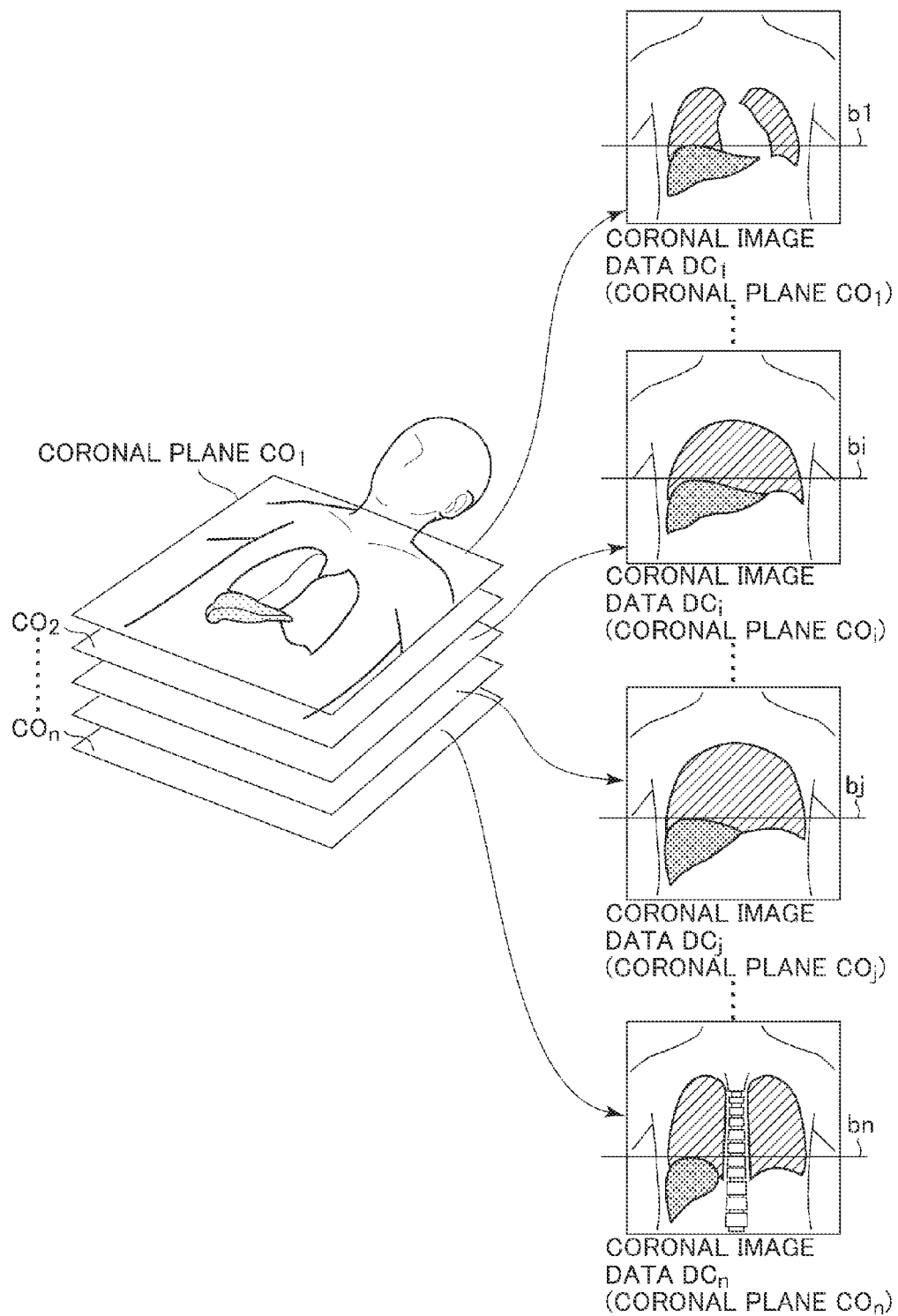
FIG. 23 is a diagram schematically showing boundaries $b_1$ through $b_n$ between the lung and liver, which have been detected for every $CO_1$ through $CO_n$ of coronal planes.

At step ST12, the boundary detecting unit 99 (refer to FIG. 1) detects the boundaries between the lung and the liver, based on the coronal image data $DC_1$ through $DC_n$. Since the liver is a high signal but the lung is a low signal, steps of signal values appear in the boundaries between the lug and the liver. Thus, the boundaries between the liver and the lung can be detected by detecting the steps of the signal values. Boundaries $b_1$ through $b_n$ between the lung and the liver, which have been detected for every $CO_1$ through $CO_n$ of coronal planes, are schematically shown in FIG. 23. After the detection of the boundaries $b_1$ through $b_n$ between the lung and the liver, the boundary located on the extreme S side is determined from within the boundaries $b_1$ through $b_n$. Here, the boundary $b_i$ is assumed to be located on the extreme S side. Thus, the boundary detecting unit 99 determines the boundary $b_i$ to be the boundary between the lung and liver of a subject. After the determination of the boundary $b_i$, the operation flow proceeds to step ST20.

Since steps ST20 through ST30 are identical to those in the first embodiment, their description will be omitted. At step ST30, the center positions of a blood vessel are detected for every DA1 through DAm of axial data, and thereafter the operation flow proceeds to step ST40.

Figure 24:
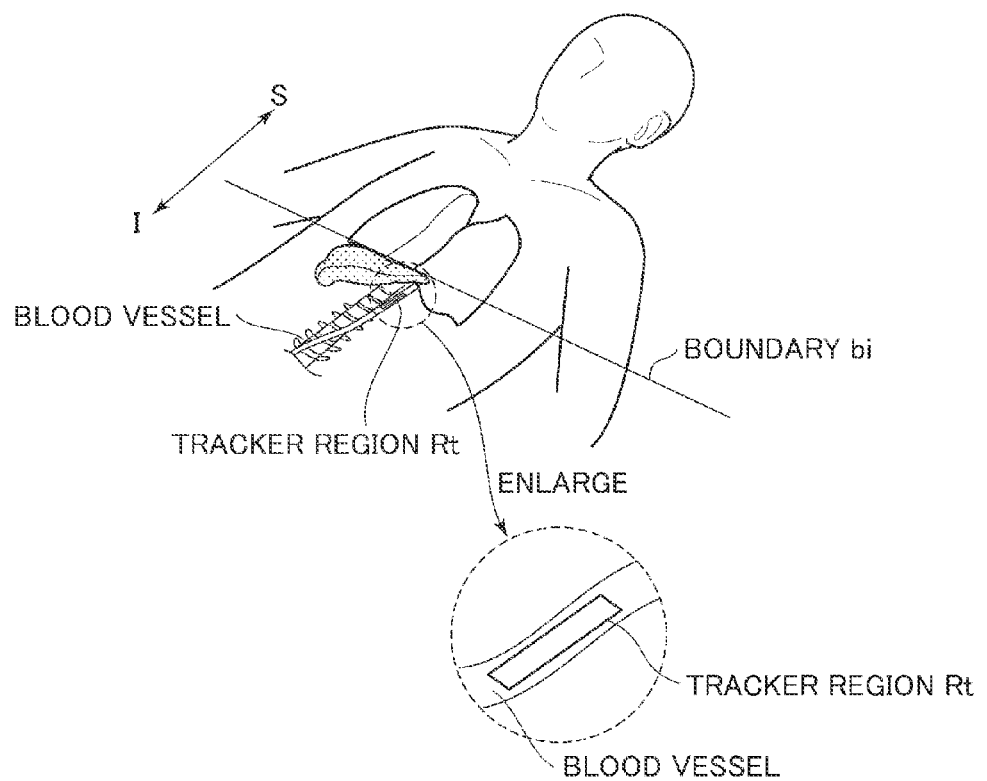
FIG. 24 is a diagram showing a tracker region $R_t$.

At step ST40, a tracker region setting unit 97 (refer to FIG. 20) sets a tracker region $R_t$ to the side closer toward I than the boundary $b_i$ between the lung and the liver, which has been detected at step ST12. The set tracker region $R_t$ is shown in FIG. 24. Setting the tracker region $R_t$ to the side closer toward I than the boundary bi makes it possible to prevent the tracker region $R_t$ from begin set to the lung side. It is therefore possible to more accurately determine whether a contrast agent reaches close to the liver.

Incidentally, although each of the first through third embodiment has described where the part such as the blood vessel is detected from the MR image data acquired by the MR apparatus, the systems and methods described herein can be applied even to the case where a region or part such as a blood vessel is detected from medical image data (e.g., CT image data acquired by CT equipment) different from the MR image data.

Many widely different embodiments may be configured without departing from the spirit and the scope of the disclosure. It should be understood that the disclosure is not limited to the specific embodiments described in the specification, except as defined in the appended claims.

The disclosure is applied to the detecting apparatus which detects the predetermined part of the subject by rotating the window, and the apparatus can detect the predetermined part in a short period of time.

What is claimed is:

1. A detecting apparatus of a magnetic resonance imaging (MRI) system is configured to detect a position of a blood vessel of a subject, based on image data of a region including the blood vessel, the detecting apparatus comprising:
    a first detecting unit configured to detect a reference position from within the image data, wherein the reference position is used to detect the blood vessel and is positioned outside of the blood vessel;
    a determining unit configured to rotate a window for detecting the position of the blood vessel about the reference position, and configured to determine a rotational angle of the window when the blood vessel is included in the window; and
    a second detecting unit configured to set an actual rotational angle of the window to the determined rotational angle and configured to detect the position of the blood vessel from within the window;
    wherein the first detecting unit includes a center line setting unit configured to set a center line of a body of the subject, and a correcting unit configured to correct the center line of the body such that the center line of the body crosses the reference position; and
    wherein the first detecting unit is configured to detect the reference position on the corrected center line of the body.

2. The detecting apparatus according to claim 1, wherein the determining unit is further configured to change a size of the window and configured to determine a size of the window when the blood vessel is included in the window; and wherein the second detecting unit is configured to set the size of the window to the size determined by the determining unit.

3. The detecting apparatus according to claim 2, wherein the window is defined by n×m pixels; and wherein the determining unit is configured to change at least one of a value of n and a value of m to thereby change the size of the window.

4. The detecting apparatus according to claim 2, wherein the second detecting unit is configured to set a detection region within the window for detecting a region of the blood vessel, and configured to detect the position of the blood vessel, based on data of the detection region.

5. The detecting apparatus according to claim 3, wherein the second detecting unit is configured to set a detection region within the window for detecting a region of the blood vessel, and configured to detect the position of the blood vessel, based on data of the detection region.

6. The detecting apparatus according to claim 1, wherein the second detecting unit is configured to set a detection region within the window for detecting a region of the blood vessel, and configured to detect the position of the blood vessel, based on data of the detection region.

7. The detecting apparatus according to claim 6, wherein the second detecting unit is configured to set a seed point within the detection region for detecting the region of the blood vessel, and configured to detect the position of the blood vessel from within the region of the blood vessel, which has been detected using the seed point as a reference.

8. The detecting apparatus according to claim 1, wherein the first detecting unit is configured to set a window onto the corrected center line of the body, configured to move the window on the corrected center line of the body, and configured to detect the reference position, based on a signal value in the window at each movement position.

9. The detecting apparatus according to claim 1, wherein the correcting unit is configured to set a predetermined region including the reference position onto the center line of the body, and configured to correct the center line of the body, based on data of the predetermined region.

10. The detecting apparatus according to claim 9, wherein the correcting unit is configured to perform alignment between the predetermined region and an inversion region obtained by inverting the predetermined region, and configured to correct the center line of the body, based on a result of the alignment.

11. The detecting apparatus according to claim 10, wherein the reference position is a position where cerebrospinal fluid flows; and wherein a backbone is included in the predetermined region.

12. The detecting apparatus according to claim 1, wherein the reference position is a position where cerebrospinal fluid flows.

13. The detecting apparatus according to claim 1, further comprising a range specifying unit configured to specify a range of an in vivo region of the subject, based on the image data.

14. The detecting apparatus according to claim 1, further comprising a tracker region setting unit configured to set a tracker region for detecting a contrast agent flowing to the blood vessel.

15. The detecting apparatus according to claim 14, further comprising a boundary detecting unit configured to detect a boundary between a lung and a liver; and wherein the tracker region setting unit is configured to set the tracker region to a side closer toward the liver than the boundary.

16. The detecting apparatus according to claim 1, wherein the image data is axial image data.

17. A medical apparatus comprising a detecting apparatus configured to detect a position of a blood vessel of a subject, based on image data of a region including the blood vessel, the detecting apparatus comprising:
- a first detecting unit configured to detect a reference position from within the image data, wherein the reference position is used to detect the blood vessel and is positioned outside of the blood vessel;
- a determining unit configured to rotate a window for detecting the position of the blood vessel about the reference position, and configured to determine a rotational angle of the window when the blood vessel is included in the window; and
- a second detecting unit configured to set an actual rotational angle of the window to the determined rotational angle and configured to detect the position of the blood vessel from within the window;
- wherein the first detecting unit includes a center line setting unit configured to set a center line of a body of the subject, and a correcting unit configured to correct the center line of the body such that the center line of the body crosses the reference position; and
- wherein the first detecting unit is configured to detect the reference position on the corrected center line of the body.

* * * * *